(12) United States Patent
Mallikarjunan et al.

(10) Patent No.: US 11,626,279 B2
(45) Date of Patent: Apr. 11, 2023

(54) COMPOSITIONS AND METHODS FOR MAKING SILICON CONTAINING FILMS

(71) Applicant: VERSUM MATERIALS US, LLC, Tempe, AZ (US)

(72) Inventors: Anupama Mallikarjunan, Macungie, PA (US); Andrew David Johnson, Doylestown, PA (US); Meiliang Wang, Shanghai (CN); Raymond Nicholas Vrtis, Orefield, PA (US); Bing Han, Beijing (CN); Xinjian Lei, Vista, CA (US); Mark Leonard O'Neill, Gilbert, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 148 days.

(21) Appl. No.: 14/383,690

(22) PCT Filed: Mar. 8, 2013

(86) PCT No.: PCT/US2013/029900
§ 371 (c)(1),
(2) Date: Sep. 8, 2014

(87) PCT Pub. No.: WO2013/134653
PCT Pub. Date: Sep. 12, 2013

(65) Prior Publication Data
US 2015/0014823 A1    Jan. 15, 2015

Related U.S. Application Data

(60) Provisional application No. 61/608,955, filed on Mar. 9, 2012.

(51) Int. Cl.
*H01L 21/02* (2006.01)
*H01L 29/786* (2006.01)
(Continued)

(52) U.S. Cl.
CPC ...... *H01L 21/02164* (2013.01); *C23C 16/402* (2013.01); *C23C 16/505* (2013.01);
(Continued)

(58) Field of Classification Search
None
See application file for complete search history.

(56) References Cited

U.S. PATENT DOCUMENTS

| 4,981,724 A | 1/1991 | Hochberg et al. |
| 5,040,046 A | 8/1991 | Chhabra et al. |

(Continued)

FOREIGN PATENT DOCUMENTS

| EP | 1862566 A1 | 12/2007 |
| JP | 05145074 A | 6/1993 |

(Continued)

OTHER PUBLICATIONS

Kawase (Japanese Journal of Applied Physics 48 (2009)101401).*
(Continued)

*Primary Examiner* — Joel G Horning
(74) *Attorney, Agent, or Firm* — David Benson

(57) ABSTRACT

Described herein are low temperature processed high quality silicon containing films. Also disclosed are methods of forming silicon containing films at low temperatures. In one aspect, there are provided silicon-containing film having a thickness of about 2 nm to about 200 nm and a density of about 2.2 g/cm³ or greater wherein the silicon-containing thin film is deposited by a deposition process selected from a group consisting of chemical vapor deposition (CVD), plasma enhanced chemical vapor deposition (PECVD), cyclic chemical vapor deposition (CCVD), plasma enhanced cyclic chemical vapor deposition (PECCVD, atomic layer deposition (ALD), and plasma enhanced atomic layer deposition (PEALD), and the vapor deposition is conducted at (Continued)

one or more temperatures ranging from about 25° C. to about 400° C. using an alkylsilane precursor selected from the group consisting of diethylsilane, triethylsilane, and combinations thereof.

13 Claims, 16 Drawing Sheets

(51) Int. Cl.
*C23C 16/505* (2006.01)
*C23C 16/40* (2006.01)
*H01L 29/49* (2006.01)
*H01L 29/51* (2006.01)
*H01L 21/443* (2006.01)

(52) U.S. Cl.
CPC .... *H01L 21/0228* (2013.01); *H01L 21/02208* (2013.01); *H01L 21/02271* (2013.01); *H01L 21/02274* (2013.01); *H01L 29/4908* (2013.01); *H01L 29/51* (2013.01); *H01L 29/7869* (2013.01); *H01L 21/443* (2013.01)

(56) References Cited

U.S. PATENT DOCUMENTS

| | | | |
|---|---|---|---|
| 6,207,590 B1 | 3/2001 | Shan | |
| 2004/0094808 A1* | 5/2004 | Joshi | H01L 29/4908 257/405 |
| 2007/0190768 A1 | 8/2007 | Sato et al. | |
| 2008/0139003 A1* | 6/2008 | Pirzada | H05H 1/46 438/785 |
| 2009/0104790 A1 | 4/2009 | Liang | |
| 2010/0220254 A1* | 9/2010 | Liu | H01L 33/08 349/46 |
| 2011/0001135 A1 | 1/2011 | Chou et al. | |
| 2012/0128897 A1 | 5/2012 | Xiao et al. | |

FOREIGN PATENT DOCUMENTS

| | | |
|---|---|---|
| JP | 06097158 A | 4/1994 |
| JP | 10092815 A | 4/1998 |
| JP | 2005191482 A | 7/2005 |
| JP | 2006190872 A | 7/2006 |
| JP | 2007048811 A | 2/2007 |
| JP | 2010263103 A2 | 11/2010 |
| JP | 2011014858 A | 1/2011 |
| KR | 1020060006015 | 1/2006 |
| KR | 1020070037505 | 4/2007 |
| KR | 1020110002405 | 1/2011 |
| KR | 1020110122830 | 11/2011 |
| TW | 201202466 | 1/2012 |

OTHER PUBLICATIONS

K. Kawase et al., "Densification of chemical vapor deposition silicon dioxide film using oxygen radical oxidation", Journal of Applied Physics, vol. 111, No. 3, Feb. 1, 2012, 7 pages.
R. A. Levy, et al., "A comparative study of plasma enhanced chemically vapor deposited Si—O—H and Si—N—C—H films using the environmentally benign precursor diethylsilane", Materials Letters, vol. 54, No. 2-3, May 1, 2002, pp. 102-107.
S.W. Hsieh, et al., "Characteristics of Low-temperature and Low-energy Plasma-enhanced chemical vapor deposited SiO2", Journal of Applied Physics, vol. 74, No. 4, Aug. 15, 1993, pp. 2638-2648.

* cited by examiner

COMPOSITIONS AND METHODS FOR MAKING SILICON CONTAINING FILMS

CROSS REFERENCE TO RELATED APPLICATIONS

This patent application claims the priority benefit of U.S. Provisional Patent Application Ser. No. 61/608,955 filed Mar. 9, 2012.

BACKGROUND OF THE INVENTION

Disclosed herein are methods and compositions to prepare silicon-containing films, such as but not limited to, stoichiometric or non-stoichiometric silicon oxide or silicon dioxide ($SiO_2$) films, for use in various electronic applications.

Thin films of silicon oxide are commonly used as dielectrics in semiconductor manufacturing because of their dielectric properties. In the manufacturing of silicon-based semiconductor devices, silicon oxide films can be used as gate insulation layers, diffusion masks, sidewall spacers, hard mask, anti-reflection coating, passivation and encapsulation, and a variety of other uses. Silicon oxide films are also becoming increasingly important for passivation of other compound semiconductor devices.

Other elements besides silica and oxygen may be present in silicon dioxide films. These other elements may sometimes be intentionally added into the compositional mixture and/or deposition process depending upon the resultant application of the film or desired end-properties. For example, the element nitrogen (N) may be added to the silicon oxide film to form a silicon oxynitride film that may provide a certain dielectric performance such as lower leakage current. The element geranium (Ge) may be added to the silicon oxide film to provide a Ge-doped $SiO_2$ that may reduce the deposition temperature of the film. Still other elements, such as boron (B) or carbon (C), may be added to the silicon oxide film to increase the etch resistance. In other cases, the elements may be incorporated as impurities during the deposition process. For example, if an organic precursor is used, carbon (C) and/or hydrogen (H) may be incorporated into the resultant film.

For several applications, plasma enhanced chemical vapor deposition (PECVD) process is used to produce silicon oxide films at lower temperatures than thermal CVD. Tetraethyoxysilane or TEOS (molecular formula $Si(OC_2H_5)_4$) is a common precursor for depositing a silicon oxide film via PECVD. It is typically used in combination with a high flow of oxygen sources such as $O_2$ or $O_3$ to minimize residual carbon contamination in the deposited films. TEOS is supplied as a stable, inert, high vapor pressure liquid, and is less hazardous than other precursors such as silane ($SiH_4$).

There is a general drive to move to lower deposition temperatures, or deposition temperatures of 400° C. or below, for various reasons such as cost (for example, the ability to use cheaper substrates), and thermal budget (for example, due to the integration of temperature-sensitive high performance films). In addition, for films deposited via PECVD using TEOS, gapfill and conformality are better at these lower deposition temperatures. However, the quality of these films are poorer. In this regard, the TEOS-deposited films do not have a stoichiometric composition, are hydrogen rich, and accordingly have a low film density, and fast etch rate. The performance of these films under thermal and/or electrical stress (e.g. leakage current and breakdown voltage after annealing or the flatband voltage shift under Bias Temperature Stressing) is correspondingly worse.

Hence, there is a need for alternative precursors that deposit at lower deposition temperature ranges but provide a better quality silicon oxide or silicon dioxide film than TEOS.

Thin film transistors (TFTs) for flat panel displays benefit from lower processing temperature so that alternative substrates (that are lighter and less expensive than current glass) can be used. For this reason, plasma enhanced chemical vapor deposition (PECVD) has emerged as the preferred method for depositing films used for TFTs. AOS (amorphous oxide semiconductors) are fast emerging as a-Si replacement for TFTs that gives higher performance, and are processable at lower T. Indium Gallium Zinc Oxide (IGZO) and variations are main candidates. Alternative AOS materials include ITZO, AlInOx, ZTO, ZnON, and MgZnO. IGZO materials have a temperature limitation of <350° C. Novel gate metals may also have temperature limitations. Furthermore, it is desirable to further lower the processing temperature to <200° C. for plastic substrates, the PECVD films deposited from standard precursors such as silane or TEOS cannot balance all the requirements such as density, electrical quality and conformality. Hence, there is a need for alternative precursor chemistries that can work in conjunction with deposition and process engineering methods to produce high quality TFT films at lower deposition temperatures.

In case of silicon oxides, TEOS (tetraethyorthosilicate) is the preferred liquid precursor for forming silicon oxide or silicon dioxide films via PECVD and is usually reacted with oxygen. However, the reference entitled "P-1: The Application of Tetraethoxysilane (TEOS) Oxide to a-Si:H TFTs as the Gate Insulator", J. K. Lee et al., ISSN 0098-0966X/98/2901 (1998) ("Lee et al.") describes the use of a bottom gate a-Si:H thin film transtitor (TFT) with tetraethoxysilane (TEOS) deposited oxide as a gate insulator. In Lee et al., the TEOS oxide film of 2000 Å deposited at 300° C. has a high breakdown strength which is twice that of the SiNx film of 2000 Å prepared by PECVD. The authors demonstrate in Table 2 that a TEOS 1800 A/SiNx 500 A stack has better TFT properties than a much thicker $Al_2O_3$ 1000 A/SiNx 4000 A stack. According to the authors' conclusion, productivity (in terms of throughput) can be increased without lowering production yield by decreasing the total gate insulator thickness.

The reference entitled "Monte Carlo Simulation of Surface Kinetics During Plasma Enchanced Chemical Vapor Deposition of $SiO_2$ Using Oxygen/Tetraethoxysilane Chemistry", P. J. Stout et al., J. Vac. Sci. Techynol. A 11(5), September/October 1993, pp. 2562-71 ("Stout et al."), provides a multi-step theoretical model for the PECVD deposition mechanism of high $O_2$/TEOS ratio films. In the model described in Stout et al., $Si(OR)_n(OH)_{4-n}$ where n=1-3 and O species are incident on the substrate. The $SiO_2$ network then propagates by elimination of —OH groups.

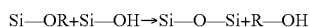

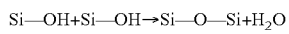

Stout et al. shows that $Si(OR)_n(OH)_{4-n}$ species can occur if the last reaction does not happen completely, such as with a low temperature deposition process. Thus, the resultant film may contain Si—OH bonding.

The reference entitled "Thickness Dependence of Properties of Plasma Deposited Amorphous SiO2 Films", L. N. He et al., Jpn. J. Appl. Phys. Vol. 40 (2001), pp. 4672-4676 ("He et al.") teaches a process for preparing amorphous $SiO_2$ films prepared by PECVD at 300° C. using mixtures of $SiH_4$—$O_2$. The $[O_2]/[SiH_4]$ ratio was maintained at 1.5, in which oxide films having a stoichiometric composition could be obtained. The Si—O—Si stretching mode, stress, the density of Si dangling bonds and buffered HF (BHF) etch rate were investigated as a function of film thickness. It was found that the peak frequency of Si—O—Si stretching mode centered at around 1050 cm$^{-1}$ increased from 1050 to 1075 cm$^{-1}$ with increasing film thickness from 0.1 to 1.1 µm. By comparison with calculations based on the effect of multiple reflections in film/substrate system, it was found that the shift of the Si—O—Si stretching mode to high frequencies was due not only to the effect of multiple reflections, but also to the physical effect of thermal heating and/or ion bombardment during film growth, which would contribute to rearrangement of the Si—O—Si bonding network. He et al. shows in FIGS. 5a and 5b that the buffered hydrofluoric acid (BHF) etch rate in A/second and the density of the Si dangling bonds in the film shown as (Ns) value increases as the film thickness in µm decreases. It is stated in literature that thicker PECVD SiO$_2$ films have a lower degree of disorder in the bonding network, less defects, and a lower BHF etch rate. The lower BHF etch rate is indicative of decreased microvoids. All the above properties are therefore a proxy for increased film density. The reason is expected to be the effects of thermal heating and ion bombardment during film growth, which would contribute to the arrangement of the Si—O—Si bonding network. Thus, it is inferred from the findings in He et al. that thinner films would be of poorer quality than thicker films.

He et al. teaches that a passivation layer requires nearly 0.1 µm thickness whereas a gate dielectric layer requires less than 0.1 µm thickness. In gate dielectric layer applications, the thinner gate dielectric layers are desirable to increase capacitance, and therefore decrease the threshold voltage required, to turn the transistor on or off. However, practical considerations such as film leakage current, breakdown voltage and ability to deposit pin-hole free dielectrics or conformal dielectrics dictate that thicker films need to be used. The reference authored by Lee et al demonstrates this problem and shows that a thinner gate dielectric or dielectric stack can have a significant benefit for a device such as a TFT. Hence, there is a need to solve the problem of depositing high quality but thinner films. This problem is especially critical when a lower deposition temperature is needed. It can be inferred from Stout et al, that if Si—OH reaction does not complete (e.g. because the deposition is conducted at a low temperature), the TEOS-deposited SiO$_2$ films can have residual silanol (Si—OH) incorporation.

The quality of thin films can be measured by several properties such as density, stress, refractive index, transparency, wet etch rate, dry etch resistance and selectivity, film composition and deviation from stoichiometry, impurity content, trapped moisture, trapped hydrogen (in different bound chemical forms and mobile forms). Some electrical properties of interest are breakdown voltage, leakage, charge to breakdown, interface states, interface charge, surface charge, fixed charge, bulk traps, mobile charge, interface traps, dielectric constant; and the stability of these parameters when the thin film is subjected to electrical and/or thermal stresses. The structural, optical and electrical properties are usually interrelated and are of particular interest for the gate insulator or passivation insulator for the TFT application. For example, a higher density film is expected to have less impurities or defects, and hence, better barrier or electrical insulator performance.

It is generally recognized that extremely thin films (few angstroms thick) may have different properties than thicker films. Such effects may be due to, for example, the stabilization time needed for the initial deposition (e.g. plasma-based deposition), nucleation effects (which may depend on substrate), stress effects due to the substrate, and combinations thereof. As the film grows thicker, the effect of thermal annealing and densification improves the properties of the film to be more bulk-like.

The reference entitled "Low pressure chemical vapor deposition of silicon dioxide using ditheylsilane" Chem Mater 5, 1993, p. 1710 by Levy, Grow and Chakravarthy teach a low-pressure chemical vapor deposition of SiO$_2$ films by using diethylsilane as a precursor. These films were deposited at temperature ranging from 350 to 475° C. with the growth rate observed to follow an Arrhenius behavior with apparent activation energy of 10 kcal/mol. The growth rate was seen to increase with higher pressure and to vary as a function of the square root of the O flow rate and O/DES ratio. In both the pressure and the O/DES ratio studies conducted at 400° C., there were points of abrupt cessation in deposition. The density and index of refraction of the films were found to be 2.25 g/cm$^3$ and 1.46, respectively, independent of deposition conditions. The etch rate of the films in a 25° C. P-etch solution (e.g., volume ratio of 15 parts HF (49%):10 parts HNO$_3$ (70%): 300 parts H$_2$O) decreased with higher deposition or annealing temperatures reflecting densification of the material. For aspect ratios at approximately 1.3, the films exhibited a step coverage better than 55%.

The reference entitled, "Diethylsilane on silicon surfaces: Adsorption and decomposition kinetics" Coon, P. A. et al., J. Vac. Sci. Technol. B, Vol 10 (1992), pp. 221-227, ("Coon et al.") studied the adsorption and decomposition kinetics of diethylsilane (DES), (CH$_3$CH$_2$)$_2$SiH$_2$, on silicon surfaces, using laser-induced thermal desorption (LITD), temperature programmed desorption, and Fourier transform infrared (FTIR) spectroscopic techniques. LITD measurements determined that the initial reactive sticking coefficient of DES on Si(111) 7×7 decreased versus surface temperature from $S_0 \cong 1.7 \times 10-3$ at 200 K to $S_0 \cong 4 \times 10^{-5}$ at 440 K. The temperature-dependent sticking coefficients suggested a precursor-mediated adsorption mechanism. FTIR studies on high surface area porous silicon surfaces indicated that DES adsorbs dissociatively at 300° C. and produces SiH and SiC$_2$H$_5$ surface species. Annealing studies also revealed that the hydrogen coverage on porous silicon increased as the SiC$_2$H$_5$ surface species decomposed. CH$_2$=CH$_2$ and H$_2$ were the observed desorption products at 700 and 810 K, respectively, following DES adsorption on Si(111) 7×7. The ethylene desorption and growth of hydrogen coverage during ethyl group decomposition were consistent with a β-hydride elimination mechanism for the SiC$_2$H$_5$ surface species, i.e., SiC$_2$H$_5$→SiH+CH$_2$=CH$_2$. Isothermal LITD studies monitored the decomposition kinetics of SiC$_2$H$_5$ on Si(111) 7×7 as a function of time following DES exposures. The first-order decomposition kinetics were Ed=36 kcal/mol and vd=2.7×109 s$^{-1}$. These decomposition kinetics suggest that the silicon surface catalyzes the β-hydride elimination reaction.

The reference entitled "Study of Plasma-Deposited Amorphous SiO$_2$ films Using Infrared Absorption Techniques", He L. et al., Thin Solid Films 384(2) (2001), pp. 195-199, ("He et al. II") teach the preparation of amorphous SiO$_2$ (a-SiO$_2$) films at 300° C. by means of plasma-enhanced chemical vapor deposition (PE-CVD) using a SiH$_4$—O$_2$ mixture. The properties of infrared (IR) absorption for Si—O bonds have been investigated as a function of film thickness (d). He et al. II teaches that the apparent absorbances, α app, for both 800 and 1050 cm$^{-1}$ bands, arising from Si—O bending and stretching modes, respectively, were proportional to d as αapp=k×d. The proportionally constants k for 800 and 1050 cm$^{-1}$ bands are estimated to be 3.2×103 and 2.9×104 cm$^{-1}$, respectively. Consequently, the film thickness for PE-CVD a-SiO$_2$ can be determined non-destructively using IR absorption techniques. However, the integrated absorption intensity for the 1050 cm$^{-1}$ bands increased with increasing film thickness. In contrast, the integrated absorption intensity for 800 cm$^{-1}$ band was independent of film thickness. The properties of infrared absorption for both Si—O stretching and bending modes are discussed.

The reference entitled "The LPCVD of silicon oxide films below 400 DegC from liquid sources", Hochberg, A. K. et al., J. Electrochem. Soc. FIELD Full Journal Title: Journal of the Electrochemical Society 136(6), (1989), pp. 1843-4 ("Hochberg et al.") found diethylsilane (DES) to be a safe, easily delivered, suitable source for low temperature, low pressure chemical vapor deposition (LPCVD) of SiO$_2$ films, after testing various Si compounds including TEOS and tetra-, methoxy-, tetrabutoxy-, and tetrapropoxy-silane. Hochberg et al. teaches that DES produced reasonably conformal films below 400° C. (i.e. 300 degrees lower than from tetraethoxysilane for the equivalent deposition rate). Purified DES is nonpyrophoric and nontoxic and its oxide film is superior to silane for low temperature oxide for step coverage over an aluminum substrate. Hochberg et al. also deposited P-doped Si oxide films by the addition of tri-Me phosphite to diethylsilane.

The reference entitled "SiO$_2$ films by low pressure chemical vapor deposition using diethylsilane: processing and characterization", Huo, D. T. et al., J. Vac. Sci. Technol., Journal of Vacuum Science & Technology, Vol. 9(5) (1991), pp. 2602-2606 ("Huo et al."), used diethylsilane to prepare SiO$_2$ films on Si wafers by a low pressure chemical vapor deposition technique at low temperatures (≤400° C.). The deposited films have good conformality (85%), a low residual carbon concentration (<1 atomic %) and a low residual stress (<10$^9$ dyne/cm$^2$); which compared favorably with films prepared by other processes. The growth rates were correlated with the processing parameters to show that the deposition process follows the heterogeneous bimolecular reaction kinetics. IR spectroscopy was used to detect the presence of HSi—O$_3$ bending band (880 cm–1) in SiO$_2$ films prepared under certain processing conditions. Based on the reaction kinetic model, the processing conditions were optimized to reduce the SiH incorporation and mobile charge carrier concentration in SiO$_2$ films.

The reference entitled "A Comparative Study of Plasma Enhanced Chemically Vapor Deposited Si—O—H and Si—N—C—H films Using the Environmentally Benign Precursor Diethylsilane", Levy, R. A. et al., Materials Letters, Vol. 54(2-3) (2002), pp. 102-107 (Levy I et al.) used diethylsilane (DES) as the precursor with either N$_2$O or NH$_3$ to synthesize S—O—H or Si—N—C—H films by plasma enhanced chemical vapor deposition (PECVD). The growth rates were observed to decrease with higher temperature while increase with total pressure. Oxide films with optimal properties were synthesized at a deposition temperature of 300° C., total pressure of 0.3 Torr, DES flow rate of 15 sccm, and N$_2$O/DES flow rate ratio of 16. Comparative values of refractive index, stress, hardness and Young's modulus are presented as a function of processing variables and related to film density and resulting film compositions.

The reference entitled "Plasma enhanced chemical vapor deposition of Si—N—C—H films from environmentally benign organosilanes" Levy, R. A et al., Mater. Lett. FIELD Full Journal Title: Materials Letters, Vol. 24(1,2,3) (1995), pp. 47-52, (Levy III et al.), used precursors diethylsilane (DES) and di-t-butylsilane with NH$_3$ to synthesize hydrogenated silicon carbonitride films by plasma enhanced chemical vapor deposition. The growth kinetics and film properties were examined as a function of deposition temperature, pressure, and NH$_3$/organosilane ratio.

The reference entitled "Low Pressure Chemical Vapor Deposition of Silicon Dioxide below 500° C. by the Pyrolysis of Diethylsilane in Oxygen", Patterson, J. D. et al., Journal of Vacuum Science & Technology B: Microelectronics and Nanometer Structures Vol. 10(2) (1992), pp. 625-632 ("Patterson et al."), teaches a low pressure chemical vapor deposition (LPCVD) of SiO$_2$ in a horizontal LPCVD furnace using liquid diethylsilane and oxygen. A temperature deposition window ranging from 425-500° C. was observed resulting in a maximum deposition rate of 275 Å/min. The pressure dependence of the deposition rate revealed a threshold of 950 mTorr for gas phase reactions at a deposition temperature of 450° C. Analysis of the films by Rutherford backscattering spectroscopy has indicated that as-deposited films are stoichiometric SiO$_2$ for deposition temperatures≤450° C. Best case across wafer uniformity was ±5% for a caged boat. Wet chemical and reactive ion etch rates were found to be comparable to those of thermal oxides after annealing. Cross sectional scanning electron microscopy images of the SiO$_2$ films deposited on 2 μm deep 1 μm wide silicon trenches revealed a conformality of 80%. The electrical properties of films deposited at 450° C. were studied. The electrical properties of the films were studied as-deposited and after annealing the films in a cold-wall rapid thermal annealing (RTA) system. RTAs were performed at temperatures ranging from 950 to 1100° C. in Ar, N$_2$, or O$_2$ ambients. Current-voltage, current-temperature, and capacitance-voltage measurements were performed for the electrical characterization. Catastrophic breakdown field measurements have shown electric field strengths of 9.5 MV/cm for as deposited 500 Å films. A study of the leakage current conduction mechanisms has indicated that as-deposited films exhibit trap conduction mechanisms at high electric fields and temperatures. However, if deposition is followed by a RTA in Ar or O$_2$, the leakage current follows closely the Fowler-Nordheim mechanism and yields a leakage-current electric field dependence comparable to a thermal oxide. Results have shown that values as low as 6×10$^{10}$/cm$^2$ for fixed charge density can be obtained if oxide deposition is followed by a RTA in Ar or N$_2$.

The reference entitled "Enhancement of mechanical properties of organosilicon thin films deposited from diethylsilane" Ross, A. D. et al., Journal of Vacuum Science and Technology A: Vacuum, Surfaces and Films Vol. 23(3) (2005), pp. 465-469 (Ross et al.), used the pulsed-plasma enhanced chemical vapor deposition was to deposit organosilicon thin films from diethylsilane and oxygen. Fourier-transform infrared (FTIR) analysis showed significant organic content as well as hydroxyl and silanol moieties in the as-deposited materials. FTIR showed a complete removal of hydroxyl groups after annealing at 400° C. for 1 h. This removal indicates a condensation reaction between proximal hydroxyl groups leading to the formation of additional Si—O—Si linkages, which would increase both the hardness and modulus of the film. Mechanical property measurements were in accordance with this hypothesis, as both the hardness and modulus increased by over 50% after annealing. Film structure and properties were strongly dependent on the precursor feed ratio.

The reference entitled, "Mechanisms of silicon dioxide deposition from the low pressure chemical vapor deposition of diethylsilane/oxygen mixtures", Martin, J. G. et. al., Journal of the Electrochemical Society 142(11) (1995), pp. 3873-80 ("Martin et al.), performed studies of the gas-phase products, silicon dioxide film properties, and kinetics of the diethylsilane/oxygen reaction under low pressure chemical vapor deposition (LPCVD), and conditions in both packed and unpacked stirred flow reactors. Effects of flow rate, reactant compn., pressure, and various additives (e.g., ethene, helium, toluene, methylchloride, and various peroxide) on the reaction products, product yields, and reaction rates confirm the free radical nature of the reaction and provide mechanistic interpretations for the cutoff and start-up problems sometimes encountered in the film deposition process. Additions of free radical source molecules promote the reaction. Thus process temperatures of about 400° C.+/−20° C. can be used in the LPCVD process without effecting either film quality or film deposition rate. This process temperature lowering was a main study objective. Best results, as judged by film quality and uniformity, were achieved by matching the LPCVD reactor residence time of the DES/O$_2$/promoter reaction mixture to the decomposition lifetime of the promoter. Effective process temperatures were 315° C. with added t-BuOOH, 270° C. with added n-BuNO$_3$, and 250° C. with added (t-BuO)$_2$.

U.S. Pat. No. 4,981,724 ("the '724 patent") teaches a chemical vapor deposition process for depositing silicon dioxide comprising the steps of heating a substrate upon which deposition is desired to a temperature of from about 325° C. to about 700° C. in a vacuum having a pressure of from about 0.1 to about 1.5 torr and introducing a silane selected from the group consisting of alkylsilane arylsilane and araylkylsilane wherein the alkyl- aryl- or aralkyl-moiety comprises from 2-6 carbons and oxygen or carbon dioxide into the vacuum. In one embodiment of the '724 patent, the silicon-containing feed consists essentially of diethysilane.

U.S. Pat. No. 5,040,046 ("the '046 patent") describes a process for forming silicon dioxide SiO$_2$ or silicon nitride Si$_3$N$_4$ layers on selected substrates which includes reacting diethylsilane C$_4$H$_{12}$Si with a selected oxygen-containing compound or nitrogen-containing compound in a plasma enhanced chemical vapor deposition (PECVD) chamber. The conformality of the coatings formed is in the range of 85 percent to 98 percent. The diethylsilane liquid source for the associated gas flow processing system may be maintained and operated at a source temperature as low as room temperature.

U.S. Publ. No. 2009/0104790 ("the '790 Publ.) teaches a method for forming a semiconductor structure by reacting a Si precursor and an atomic O or N precursor at a processing temperature of approximately 150° C. or less to form a Si oxide or Si—N containing layer over a substrate. The Si oxide or Si—N containing layer is UV cured within an O-containing environment.

As previously discussed above, certain applications such as those for gate insulation layers in a display device, thinner films are desirable. In this regard, gate insulation layers are desirable to increase capacitance (and therefore decrease the threshold voltage required to turn the transistor on or off). Thinner films may also be less expensive and more environmentally friendly due to less chemical use. The size of the device can also be decreased, helping with benefits of miniaturization. In certain instances, thinner films will have higher throughput and decrease the cycle time of the production process. However, practical considerations such as film leakage current and ability to deposit pin-hole free dielectrics dictate that thicker films need to be used. Hence, there is a need to resolve the problem of depositing high quality thin films which have optimal properties. The above references illustrate that it is challenging b obtain high quality films at lower deposition temperatures.

BRIEF SUMMARY OF THE INVENTION

Described herein are methods to deposit silicon-containing films and apparatus comprising silicon containing films.

In one aspect, there is provided a method for depositing a silicon-containing film on at least one surface of a substrate, the method comprising: providing the at least one surface of the substrate in a reaction chamber; introducing into the reaction chamber an alkylsilane precursor having a formula $R^1R^2R^3SiH$; wherein $R^1$ is chosen from the group consisting of a $C_{1-10}$ linear or branched alkyl group; a $C_4$ to $C_{10}$ cyclic alkyl group; a $C_3$ to $C_{12}$ alkenyl group a $C_3$ to $C_{12}$ alkynyl group; and a $C_6$ to $C_{10}$ aryl group; $R^2$ and $R^3$ are independently selected from hydrogen a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and any one of $R^2$ and $R^3$ can be linked to form a ring when $R^2$ and $R^3$ are not hydrogen; introducing into the reaction chamber an oxygen source; and depositing by a deposition process the silicon containing film on the at least one surface of the substrate at one or more reaction temperatures ranging from 25° C. to 400° C. wherein the silicon containing film comprises a thickness ranging from 2 nanometers (nm) to 200 nm and a density of about 2.2 grams per cubic centimeter (g/cm$^3$ or g/cc) or greater; wherein the deposition process is selected from a group consisting of chemical vapor deposition (CVD), plasma enhanced chemical vapor deposition (PECVD), cyclic chemical vapor deposition (CCVD), plasma enhanced cyclic chemical vapor deposition (PECCVD, atomic layer deposition (ALD), and plasma enhanced atomic layer deposition (PEALD).

In another aspect, there is provided a silicon-containing film comprising a thickness of from about 2 nm to about 200 nm; and a density of about 2.2 g/cm$^3$ or greater; wherein the silicon-containing thin film is deposited by a deposition process selected from a group consisting of chemical vapor deposition (CVD), plasma enhanced chemical vapor deposition (PECVD), cyclic chemical vapor deposition (CCVD), plasma enhanced cyclic chemical vapor deposition (PECCVD, atomic layer deposition (ALD), and plasma enhanced atomic layer deposition (PEALD), and the vapor deposition is conducted at one or more temperatures ranging from about 25° C. to about 400° C. using an alkylsilane precursor selected from the group consisting of diethylsilane, triethylsilane, and combinations thereof.

In a further aspect, there if provided a method for depositing a silicon containing film on at least one surface in a thin film transistor device, comprising: providing the at least one surface of the thin film transistor in a reaction chamber; introducing into the reaction chamber an alkylsilane precursor having a formula $R^1R^2R^3SiH$; wherein $R^1$ is chosen from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group and a $C_6$ to $C_{10}$ aryl group; $R^2$ and $R^3$ are independent/selected from hydrogen a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and any one of $R^2$ and $R^3$ can be linked to form a ring when $R^2$ and $R^3$ are not hydrogen; introducing into the reaction chamber an oxygen source; and depositing by a deposition process the silicon containing film on the at least one surface of the thin film transistor device at one or more reaction temperatures ranging from 25° C. to 400° C. wherein the silicon containing film comprises a thickness ranging from 2 nanometers to 200 nanometers and a density of 2.2 g/cm$^3$ or greater; wherein the deposition process is selected from a group consisting of chemical vapor deposition (CVD), plasma enhanced chemical vapor deposition (PECVD), cyclic chemical vapor deposition (CCVD), plasma enhanced cyclic chemical vapor deposition (PECCVD, atomic layer deposition (ALD), and plasma enhanced atomic layer deposition (PEALD).

In a still further aspect, the low temperature silicon-containing films described herein have a thickness ranging from about 2 nm to about 200 nm; and density of about 2.2 g/cm$^3$ or greater. In this or other embodiments, the density of the silicon-containing film is 2.25 g/cm$^3$ or greater. In the embodiments described herein, the density of the silicon-containing film increased as the thickness of the film decreased.

DETAILED DESCRIPTION OF THE INVENTION

Figure 1A:
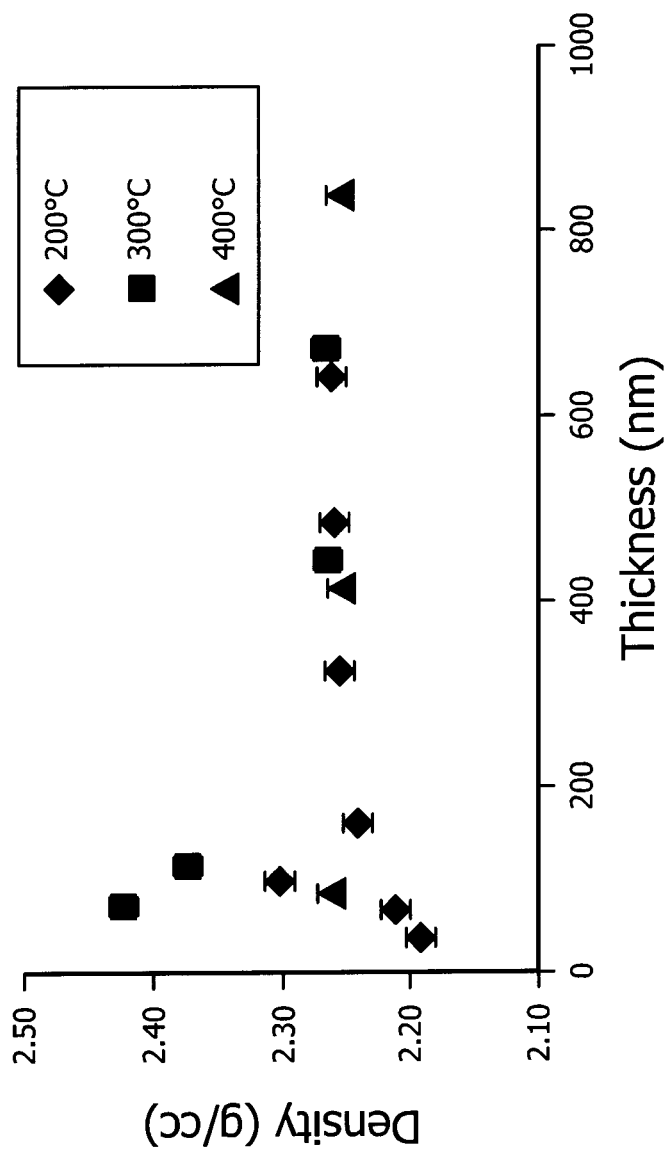
FIG. 1A shows the effect of film thickness on measured density for diethylsilane (2ES) films deposited using the BL-2 process conditions described in Table 1 of the Examples at 3 different temperatures: 400° C., 300° C., and 200° C.

Apparatuses comprising metal oxides or transparent metal oxides such as, for example, IGZO-based TFTs, are being implemented for display devices such as without limitation mobile displays. In one particular embodiment wherein the composition of the transparent metal oxide comprises IGZO, the thermal budget, which relates to the upper limit of the processing temperature that the apparatus can be subjected to, requires one or more gate insulation films be deposited at a temperature of 300° C. or less. In this or other embodiments, the one or more gate insulation layers comprises a stoichiometric or non-stoichiometric silicon oxide or silicon dioxide film having a density of about 2.2 g/cm$^3$ or greater and a thickness that ranges from about 2 nanometers to about 200 nms. In this regard, the desired properties for a silicon containing film that can be used as one or more gate insulation layers for a metal oxide layer in a display device comprise one or more of the following: a deposition temperature of about 400° C. or less; a density of about 2.2 g/cm$^3$ or 2.2 g/cc or greater; a conformality of about 50% or greater; a O/Si ratio that ranges from about 1.9 to about 2.1 (as measured by X-ray photospectrometry XPS); a leakage current density of about 1×10$^7$ A/cm$^2$ or less up to 7 MV/cm; and combinations thereof. In addition to the foregoing, in certain embodiments, the silicon containing film or layer has a hydrogen content of about 5 atomic percent (%) or less when measured using an analytical technique such as Rutherford backscattering, hydrogen forward scattering (HFS) or other methods. Also disclosed herein are methods for forming these silicon containing films at temperatures of about 400° C. or less for use as gate insulation layers. This invention will enable end users to obtain higher quality devices; e.g. faster IGZO-based TFTs and/or cheaper production by lowering processing temperature and enabling alternative substrates among other options.

Described herein is a method to deposit a silicon containing film that can be employed as one or more gate insulation layers for a display device which comprises at least one silicon-containing layer and at least one transparent metal oxide layer. The term gate insulation layer could mean, without limitation, a passivation layer, a gate dielectric layer, an etch stop layer, or other suitable layer in a display device such as a TFT device, a OLED device, a LED device or other display devices. The term silicon-containing films as used herein can mean a silicon, amorphous silicon, crystalline silicon, microcrystalline silicon, polycrystalline silicon, stoichiometric or non-stoichiometric silicon oxide, stoichiometric or non-stoichiometric silicon dioxide, carbon doped silicon oxide, silicon carbo-nitride, and silicon oxynitride films. Of the foregoing, the one or more silicon-containing films are comprised of silicon oxide or silicon dioxide. The term "metal oxide" or "transparent metal oxide" means one or more layers within the device that is suitable for use in a display device. In this regard, the metal oxide layer exhibits one or more the following properties: has requisite transparency for use in a display device, exhibits high electron mobility, and can be manufactured at low processing temperatures (e.g., 300° C. or below). Examples of metal oxides include but are not limited to, Indium Gallium Zinc Oxide (IGZO), a-IGZO (amorphous indium gallium zinc oxide), Indium Tin Zinc Oxide (ITZO), Aluminum Indium Oxide (AlInOx), Zinc Tin Oxide (ZTO), Zinc Oxynitride (ZnON), Magnesium Zinc Oxide, zinc oxide (ZnO), InGaZnON, ZnON, ZnSnO, CdSnO, GaSnO, TiSnO, CuAlO, SrCuO, LaCuOS, GaN, InGaN, AlGaN or InGaAlN and combinations thereof. In addition to the one or more gate insulation layers and metal oxide layer, the display device may further include, without limitation, gate electrode layer(s), source drain layer(s), and other layers. The apparatus and method described herein may be used to deposit the at least one silicon-containing and metal oxide layer onto at least a portion of a substrate. Examples of suitable substrates include but are not limited to, glass, plastics, stainless steel, organic or polymer films, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper, aluminum, chromium, molybdenum and gate electrodes such as but not limited to TiN, Ti(C)N, TaN, Ta(C)N, Ta, W, WN, silicon, ITO or other gate electrodes. The silicon-containing films are compatible with a variety of subsequent processing steps such as, for example, chemical mechanical planarization (CMP) and anisotropic etching processes. In one particular embodiment, the silicon-containing layer described herein has a dielectric constant that ranges from about 4.0 to about 5.5 or from about 4.0 to 4.5.

FIGS. 7a through 7d provide various examples of embodiments of the apparatus described herein. In one embodiment 10 of the apparatus described herein and shown in FIG. 7a, the silicon-containing film is deposited as a single gate insulation layer 30 onto at least a portion of a gate electrode and a transparent metal oxide 20 is deposited on the gate insulation layer 30 that can be use, for example, in a display device. In an alternative embodiment 100 of the apparatus described herein and shown in FIG. 7b, the silicon-containing film is deposited onto one or more silicon-containing films below the metal oxide layer 120 which is shown as gate insulation layer 2, or 140 on FIG. 7b, and gate insulation layer 1, or 130 on FIG. 7b, to provide a double gate insulation layer structure or multi-layered gate insulation layer structure. In one embodiment, the silicon-containing films in the double gate insulation or multi-layered are different types of silicon-containing films. Alternatively, the silicon-containing films in the double or multi-layered structures can be the same types of silicon-containing films but alternated in a variety of ways, such as without limitation, SixOy, SiwNz, SixOy, and SiwNz; SixOy, SixOy, and SiwNz; SixOy, SiwNz, and SiwNz; and various combinations thereof. While the exemplary structures shown in FIGS. 7a through 7d show the one or more gate insulation layers deposited onto at least a portion of a gate electrode and then a transparent metal oxide film is deposited on the gate insulation layer(s), it is understood that the one or more layers are not limited to arrangement of layers depicted in FIGS. 7a through 7d and may be above or below metal oxide layer and one or more gate insulation layer(s), sandwiched, imbedded, surrounded, have intervening layers which are not silicon-containing, or any other spatial relationships with respect to each other and are subsequently not limited thereto.

Figure 7B:
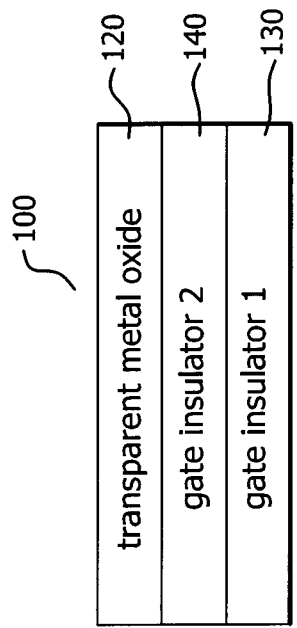
FIGS. 7a, 7b, 7c, and 7d provide examples of various embodiments of the apparatus described herein.
Figure 7D:
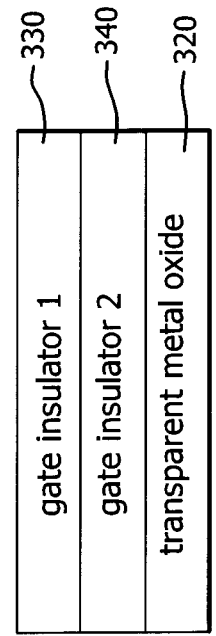
Figure 7A:
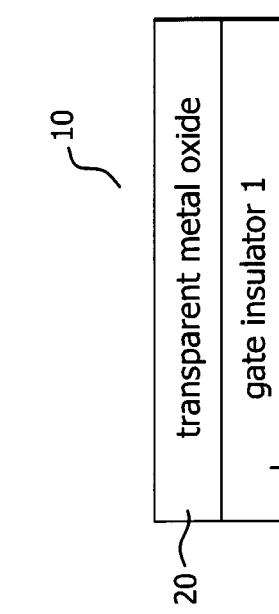
Figure 7C:
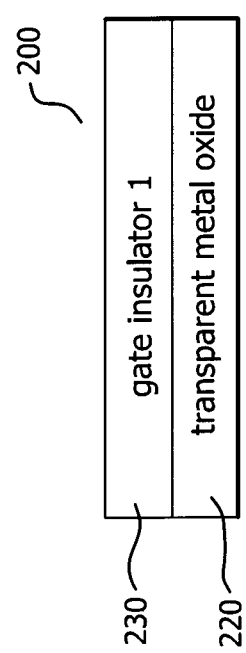

In one particular embodiment, the display device comprises one gate insulation layer deposited onto the gate electrode and then metal oxide layer is deposited on the gate insulation layer such as that shown in FIG. 7a wherein the gate insulation layer 1 comprises silicon oxide, silicon carboxide, preferably with a density about 2.2 g/cm³ or greater and a thickness ranging from about 2 nm to about 200 nm. In another particular embodiment, the display device comprises at least two gate insulation layers deposited onto the gate electrode and then metal oxide layer is deposited on the gate insulation layers such as that shown in FIG. 7b wherein the gate insulation layers comprise: a silicon-containing layer selected from the group consisting of silicon nitride and silicon carbonitride as gate insulation layer 1 or 130 and a silicon-containing layer selected from the group consisting of silicon carbide, silicon oxide, silicon carboxide, and silicon carboxynitride as gate insulation layer 2 or 140, preferably a silicon oxide with density about 2.2 g/cm³ or greater and a thickness which ranges from about 2 nm to about 200 nm. In one particular embodiment of the apparatus 100 shown in 7b, the transparent metal oxide layer 120 comprises IGZO and the at least two gate insulation layers act as a bi-layer gate dielectric. In yet another particular embodiment, the display device comprises at least one gate insulation layers deposited onto the metal oxide layer such as that shown in FIGS. 7c and 7d or apparatus 200 and 300 respectively. In one particular embodiment of FIG. 7c, apparatus 200 comprises a transparent metal oxide 220 and a gate insulation layer deposited thereupon wherein the gate insulation layer 1 or 230 comprises silicon oxide, silicon carboxide, preferably with a density about 2.2 g/cm³ or greater and a thickness ranging from about 2 nm to about 200 nm. In one particular embodiment of the apparatus 300 shown in 7d, the metal oxide layer 320 comprises IGZO and the at least two gate insulation layers can also act as a barrier to protect the IGZO film from diffusion of atmospheric impurities (e.g., be hermetic) while not impacting to any great significance the resistivity of the IGZO film post treatment. In this particular embodiment, the apparatus comprises a high density silicon nitride film (e.g., having a density of 2.4 g/cm³ or greater) as gate insulation layer 1 or 330 and is deposited by the prescursor trisilylamine (TSA) and ammonia ($NH_3$) at one or more temperatures that range from 80 to 400° C. The device further comprises a silicon oxide film as gate insulation layer 2 or 340 to prevent the diffusion of active hydrogen contained in the silicon nitride to the IGZO located beneath the oxide. The silicon oxide film can be deposited at one or more temperatures ranging from 80° C. to 400° C. It is desirable that the precursor selected and the deposition process conditions impart a minimum of hydrogen, hydroxyl groups, or other moieties such as carbon, hydrocarbons or other functional groups which can react with the metal oxide such as IGZO and lower. It is desirable that the precursor selected and the deposition process conditions impart a minimum of hydrogen, hydroxyl groups, or other moieties such as carbon, hydrocarbons or other functional groups which may react with the transparent metal oxide such as IGZO and lower. In this regard, the gate insulation layer 2 is deposited from a silicon-containing precursor for example diethylsilane(2ES) or triethylsilane(3ES) which has less Si—H groups than silane because it is known that Si—H may react with the transparent metal oxide, thus damaging the electric property of the transparent metal oxide layer. While not being bound to theory, for an apparatus having at least two gate insulation layers comprising a silicon oxide layer and a silicon nitride layer, the Applicants believe that the selection of the silicon oxide precursor and its deposition parameters and the silicon nitride and its deposition parameters are important to ensure that the attributes of one or more gate insulation layers do not adversely impact the resistivity of the transparent metal oxide layer.

The method used to form the one or more silicon-containing film(s) or layer(s) and the metal oxide layer(s) are referred to herein as deposition processes. Examples of suitable deposition processes for the method disclosed herein include, but are not limited to, chemical vapor depositions (CVD), cyclic CVD (CCVD), MOCVD (Metal Organic CVD), thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, CVD of a liquid polymer precursor, deposition from supercritical fluids, and low energy CVD (LECVD). In certain embodiments, the films are deposited via atomic layer deposition (ALD), plasma enhanced ALD (PEALD) or plasma enhanced cyclic CVD (PECCVD) process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can also be liquid or solid which are transported with or without an inert gas into the reactor via direct vaporization, bubbling or sublimation. In some case, the vaporized precursors can pass through a plasma generator. In one embodiment, the one or more films is deposited using an ALD process. In another embodiment, the one or more films is deposited using a CCVD process. In a further embodiment, the one or more films is deposited using a thermal CVD process. The term "reactor" as used herein, includes without limitation, reaction chamber or deposition chamber.

In certain embodiments, the method disclosed herein avoids pre-reaction of the precursors by using ALD or CCVD methods that separate the precursors prior to and/or during the introduction to the reactor. In this connection, deposition techniques such as ALD or CCVD processes are used to deposit the film. In one embodiment, the film is deposited via an ALD process by exposing the substrate surface alternatively to the one or more the silicon-containing precursor, oxygen source, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases.

The selection of precursor materials for deposition depends upon the desired resultant dielectric material or film. For example, a precursor material may be chosen for its content of chemical elements, its stoichiometric ratios of the chemical elements, its deposition rate control, and/or the resultant dielectric film or coating that are formed under CVD. The precursor material may also be chosen for various other characteristics such as cost, non-toxicity, handling characteristics, ability to maintain liquid phase at room temperature, volatility, molecular weight, etc. The thin (e.g., about 2 nm to about 200 nm) silicon-containing films disclosed herein are deposited using a silicon-containing precursor, such as but not limited to alkylsilanes having the following formula: $R^1R^2R^3SiH$ wherein $R^1$ is chosen from the group consisting of a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group; $R^2$ and $R^3$ are independently selected from hydrogen; a $C_{1-10}$ linear or branched alkyl group; a $C_4$ to $C_{10}$ cyclic alkyl group; a $C_3$ to $C_{12}$ alkenyl group; a $C_3$ to $C_{12}$ alkynyl group; and a $C_6$ to $C_{10}$ aryl group and wherein $R^1$ and any one of $R^2$ and $R^3$ can be linked to form a ring when $R^2$ and $R^3$ are not hydrogen.

Examples of alkylsilanes, that can be used in the method described herein or to deposit on or more silicon-containing layers in the apparatus described herein, include but are not limited to, diethylsilane (2ES), di(tert-butyl)silane, di(iso-propyl)silane, di(sec-butyl)silane, di(iso-butyl)silane, di(tert-amyl)silane, triethylsilane (3ES), tri(tert-butyl)silane, tri(iso-propyl)silane, tri(sec-butyl)silane, tri(iso-butyl)silane, tri(tert-amyl)silane, tert-butyldiethylsilane, tert-butyldipropylsilane, diethylisopropylsilane, cyclopentylsilane, and phenylsilane.

In the formulas above and throughout the description, the term "alkyl" denotes a linear, or branched functional group having from 1 to 10 or 1 to 4 carbon atoms. Exemplary alkyl groups include, but are not limited to, methyl, ethyl, n-propyl, isopropyl, n-butyl, isobutyl, sec-butyl, tert-butyl, n-pentyl, iso-pentyl, tert-pentyl, hexyl, isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto.

In the formulas above and throughout the description, the term "cyclic alkyl" denotes a cyclic functional group having from 3 to 12 or from 4 to 10 carbon atoms. Exemplary cyclic alkyl groups include, but are not limited to, cyclobutyl, cyclopentyl, cyclohexyl, and cyclooctyl groups.

In the formulas above and throughout the description, the term "aryl" denotes an aromatic cyclic functional group having from 6 to 12 carbon atoms. Exemplary aryl groups include, but are not limited to, phenyl, benzyl, chlorobenzyl, tolyl, and o-xylyl.

In the formulas above and throughout the description, the term "alkenyl group" denotes a group which has one or more carbon-carbon double bonds and has from 2 to 12 or from 2 to 6 carbon atoms. Exemplary alkenyl groups include, but are not limited to, vinyl or allyl groups In the formulas above and throughout the description, the term "alkynyl group" denotes a group which has one or more carbon-carbon triple bonds and has from 2 to 12 or from 2 to 6 carbon atoms.

In the formulas above and throughout the description, the term "alkoxy" denotes an alkyl group which has is linked to an oxygen atom (e.g., R—O) and may have from 1 to 12, or from 1 to 6 carbon atoms. Exemplary alkoxy groups include, but are not limited to, methoxy (—OCH$_3$), ethoxy (—OCH$_2$CH$_3$), n-propoxy (—OCH$_2$CH$_2$CH$_3$), and iso-propoxy (—OCHMe$_2$).

In certain embodiments, one or more of the alkyl group, alkenyl group, alkynyl group, alkoxy group, and/or aryl group in the formulas above may be substituted or have one or more atoms or group of atoms substituted in place of, for example, a hydrogen atom. Exemplary substituents include, but are not limited to, oxygen, sulfur, halogen atoms (e.g., F, Cl, I, or Br), nitrogen, and phosphorous. In other embodiments, one or more of the alkyl group, alkenyl group, alkynyl group, alkoxy group, and/or aryl in the formula may be unsubstituted.

In certain embodiments, substituents $R^1$ and $R^2$ or substitutents $R^1$ and $R^3$ are linked in the above formula are linked to form a ring structure when $R^2$ and $R^3$ are not hydrogen. As the skilled person will understand, where $R^1$ and $R^2$ or $R^1$ and $R^3$ are linked together to form a ring, $R^1$ will include a bond (instead of a hydrogen substituent) for linking to $R^2$ or $R^3$ and vice versa. Thus, in the example above $R^1$ may be selected from a linear or branched $C_1$ to $C_{10}$ alkylene moiety; a $C_2$ to $C_{12}$ alkenylene moiety; a $C_2$ to $C_{12}$ alkynylene moiety; a $C_4$ to $C_{10}$ cyclic alkyl moiety; and a $C_6$ to $C_{10}$ arylene moiety. In these embodiments, the ring structure can be unsaturated such as, for example, a cyclic alkyl ring, or saturated, for example, an aryl ring. Further, in these embodiments, the ring structure can also be substituted or substituted. In other embodiments, substituent $R^1$ and $R^2$ or substituent $R^1$ and $R^3$ are not linked.

In certain embodiments, the thin silicon oxide containing films used as gate insulation layers are deposited using the methods described above are formed in the presence of oxygen using an oxygen source, reagent or precursor comprising oxygen. Suitable oxygen source gases include but not limited to, for example, water (H$_2$O) (e.g., deionized water, purifier water, and/or distilled water), oxygen (O$_2$), oxygen plasma, ozone (O$_3$), NO, N$_2$O, carbon monoxide (CO), carbon dioxide (CO$_2$) and combinations thereof. The deposition methods disclosed herein may involve one or more inert gases for purging, controlling the plasma or as carrier gases. In certain embodiments, the silicon-containing precursor may have one or more substituents comprising oxygen atoms. In these embodiments, the need for an oxygen source during the deposition process may be minimized. In other embodiments, the silicon-containing precursor has one of more substituents comprising oxygen atoms and also uses an oxygen source.

In certain embodiments, the oxygen source comprises an oxygen source gas that is introduced into the reactor at a flow rate ranging from about 1 to about 2000 square cubic centimeters (sccm) or from about 1 to about 1000 sccm. The oxygen source can be introduced for a time that ranges from about 0.1 to about 100 seconds. In one particular embodiment, the oxygen source comprises water having a temperature of 10° C. or greater. In embodiments wherein the film is deposited by an ALD or a cyclic CVD process, the precursor pulse can have a pulse duration that is greater than 0.01 seconds, and the oxygen source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between. The oxygen source or reagent is provided in a molecular amount less than a 1:1 ratio to the silicon precursor, so that at least some carbon is retained in the as deposited dielectric film.

In certain embodiments, the silicon-containing layer further comprises nitrogen. In these embodiments, the silicon-containing layer deposited using the methods described herein are formed in the presence of nitrogen-containing source. In one particular embodiment such as that depicted in FIG. 7b, the silicon-containing film 140 or gate insulation layer 1 comprises silicon nitride and is deposited using the methods described above are formed in the presence of nitrogen using a nitrogen, reagent or precursor comprising nitrogen. A nitrogen-containing source may be introduced into the reactor in the form of at least one nitrogen source and/or may be present incidentally in the other precursors used in the deposition process. Suitable nitrogen-containing source gases may include, for example, ammonia, hydrazine, monoalkylhydrazine, dialkylhydrazine, nitrogen, nitrogen/hydrogen, ammonia plasma, nitrogen plasma, nitrogen/hydrogen plasma, NF$_3$ and mixture thereof. In one particular embodiment, NF$_3$ is used to reduce the hydrogen content in the resulting films because hydrogen can react with the metal oxide thereby adversely effecting the performance of the display devices. In certain embodiments, the nitrogen-containing source comprises an ammonia plasma or hydrogen/nitrogen plasma source gas that is introduced into the reactor at a flow rate ranging from about 1 to about 2000 square cubic centimeters (sccm) or from about 1 to about 1000 sccm. The nitrogen-containing source can be introduced for a time that ranges from about 0.1 to about 100 seconds.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen (N$_2$), helium (He), xenon (Xe), neon, hydrogen (H$_2$), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the precursors, oxygen source, the nitrogen-containing source, and/or other precursors, source gases, and/or reagents may be performed by changing the time for supplying them to change the stoichiometric composition of the resulting dielectric film.

Energy is applied to the at least one of the silicon-containing precursor, oxygen-containing source, nitrogen-containing source, reducing agent, other precursors and/or combination thereof to induce reaction and to form the silicon-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The silicon-containing precursors may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments, the precursor formulations may include solvent component(s) of suitable character as may be desirable and advantageous in a given end use application to form a film on a substrate.

In certain embodiments, the gas lines connecting from the precursor canisters to the reaction chamber are heated to one or more temperatures depending upon the process requirements and the container of the at least one silicon-containing precursor is kept at one or more temperatures for bubbling. In other embodiments, a solution comprising the at least one silicon-containing precursor is injected into a vaporizer kept at one or more temperatures for direct liquid injection.

The rate of the deposition of the silicon-containing films or silicon oxide films described herein can be in the range of 0.1 nm to 5000 nm per minute. The rate can be controlled by varying any one or more of the following non-limiting parameters: deposition temperature, the vaporizer temperature, the flow of the line flow controller (LFC), the flow rate of the reactive of $O_2$ gas and/or the pressure at the CVD reactor. Choice of precursor can also determine the deposition rate.

The temperature of the reactor or deposition chamber for the deposition may range from one of the following endpoints: ambient temperature 25° C.; 50° C.; 75° C.; 100° C.; 125° C.; 150° C.; 175° C.; 200° C.; 225° C.; 250° C.; 300° C.; 325° C.; and any combinations thereof. In this regard, the deposition temperature may range from about 25° C. to about 325° C., 25 to about 300° C., 100° C. to 250° C., 150° C. to 325° C., or 100° C. to 300° C., or any combinations of the temperature end-points described herein.

The pressure of the reactor or deposition chamber may range from about 0.1 Torr to about 1000 Torr. The respective step of supplying the precursors, the oxygen source, and/or other precursors, source gases, and/or reagents may be performed by changing the time for supplying them to change the stoichiometric composition of the resulting dielectric film.

The substrate may be exposed to a pre-deposition treatment such as, but not limited to, a plasma treatment, chemical treatment, ultraviolet light exposure, electron beam exposure, and/or other treatments to affect one or more properties of the film. For example, it may be advantageous to subject the IGZO film to a $N_2O$ or $O_2$ or $O_3$ plasma treatment or an $O_3$ chemical treatment to ensure complete oxidation of the IGZO. This allows for the semiconducting properties to be preserved or enhanced prior to film deposition.

The resultant films or coatings may be exposed to a post-deposition treatment such as, but not limited to, a plasma treatment, chemical treatment, ultraviolet light exposure, electron bean exposure, and/or other treatments to affect one or more properties of the film.

In the method described herein, it is understood that the steps of the methods described herein may be performed in a variety of orders, may be performed sequentially or concurrently (e.g., during at least a portion of another step), and any combination thereof. The respective step of supplying the precursors and the nitrogen-containing source gases may be performed by varying the duration of the time for supplying them to change the stoichiometric composition of the resulting dielectric film.

The resultant dielectric films or coatings may be exposed to a post-deposition treatment such as, but not limited to, a plasma treatment, chemical treatment, ultraviolet light exposure, electron beam exposure, and/or other treatments to affect one or more properties of the film.

In certain embodiments, it may be advantageous to deposit a layer which has a composition gradient from top to bottom. e.g., a film comprising SiCO or SiO2 as one layer and comprising SiNC or $Si_3N_4$ as the other layer. In these embodiments, the film is deposited from a first reagent mixture comprising a silicon containing precursor and a oxygen containing precursor, eg 2ES and $O_2$, ozone, or $N_2O$, and then replacing the flow of the oxygen containing gas with an nitrogen containing gas, e.g., $N_2$, ammonia, or hydrazine. If the silicon containing precursor already contains nitrogen ten the second step may be performed using just an inert gas or hydrogen. The changing of the oxygen to nitrogen containing or inert gases can be gradual or abrupt resulting in either a gradiated layer or a bilayer structure. Such a bilayer or gradiated layer is advantageous for some applications such as, without limitation, different application needs for metal oxide and IGZO interfaces to the silicon containing film.

In addition to the foregoing, the thin silicon-containing films have applications which include, but are not limited to, computer chips, optical devices, magnetic information storages, coatings on a supporting material or substrate, microelectromechanical systems (MEMS), nanoelectromechanical systems, thin film transistor (TFT), and liquid crystal displays (LCD).

The following examples illustrate the method for preparing the silicon containing film described herein and are not intended to limit it in any way.

EXAMPLES

General Deposition Conditions

In the following examples, unless stated otherwise, properties were obtained from sample films that were deposited onto medium resistivity (8-12 Ωcm) single crystal silicon wafer substrates. All depositions were performed on an Applied Materials Precision 5000 system in a 200 mm DXZ chamber fitted with an Advanced Energy 2000 RF generator, using a TEOS process kit. The PECVD chamber is equipped with direct liquid injection delivery capability. All precursors were liquids with delivery temperatures dependent on the precursor's boiling point. Unless otherwise stated, typical precursor flow rates were 25-150 sccm, plasma power density was 0.5-3 $W/cm^2$, and pressure was 0.75-12 torr. Thickness and refractive index (RI) at 648 nm) were measured by a reflectometer. A mercury probe was utilized for all film measurements where dielectric constant, electrical breakdown field and leakage are presented. X-ray Photoelectron Spectroscopy (XPS) and Rutherford Backscattering Spectrometry (RBS)/Hydrogen Forward Scattering (HFS) were performed to determine the film composition. Hydrogen Forward Scattering (HFS) was used to quantify the hydrogen content in the films.

The etch test is carried out in 6:1 BOE solution. Exemplary dielectric films are placed in HF solution for 30 seconds, followed by rinsing in deionized (DI) water and drying before being measured again for the loss of the material during the etch. The process is repeated till the films are completely etched. The etch rate is then calculated from the slope of the etch time vs thickness etched.

FTIR data was collected on the wafers using a Thermo Nicolet 750 system in a nitrogen purged cell. Background spectra were collected on similar medium resistivity wafers to eliminate $CO_2$ and water from the spectra. Data was obtained in the range of from 4000 to 400 $cm^{-1}$ by collecting 32 scans with a resolution of 4 $cm^{-1}$. The OMNIC software package was used to process the data.

Dielectric constants, k, are calculated from a C—V curve measured with a MDC Mercury Probe. The dielectric constant is then calculated from formula k=the capacitance x the contact area/the thickness of the film.

Density was measured by X-Ray Reflectivity (XRR). All samples with nominal thicknesses<200 nm were scanned using low-resolution optics (error bar+/−0.01 $g/cm^3$). All samples with nominal thicknesses>200 nm were scanned using high-resolution optics (error bar+/−0.005 $g/cm^3$). Samples were scanned over the range 0.2≤2≤1 using a step size of 0.001 and a count time of 1 s/step. Data were analyzed using a two-layer model with the substrate defined as Si and film as $SiO_2$.

Table 1 provides a summary of the three different process conditions that were used for compare the deposition performance of the precursors studied. These are labeled herein as BL-1, BL-2 and BL-3.

TABLE 1

Summary of process conditions used for comparing precursors

| Process Condition | BL-1 | BL-2 | BL-3 |
|---|---|---|---|
| Precursor Flow (sccm) | 107 | 45 | 27 |
| He (carrier, sccm) | 1000 | 1000 | 1000 |
| $O_2$ (oxygen source) | 1100 | 1100 | 700 |
| Pressure (torr) | 8.2 | 8.2 | 3.5 |
| Spacing (mils) | 500 | 500 | 800 |
| Power Density ($W/cm^2$) | 2.27 | 2.27 | 0.87 |

Example 1

Deposition of Diethylsilane (2ES) and Triethylsilane (3ES) at Deposition Temperatures of 200° C., 250° C., 300° C., 350° C., and 400° C.

Figure 1B:
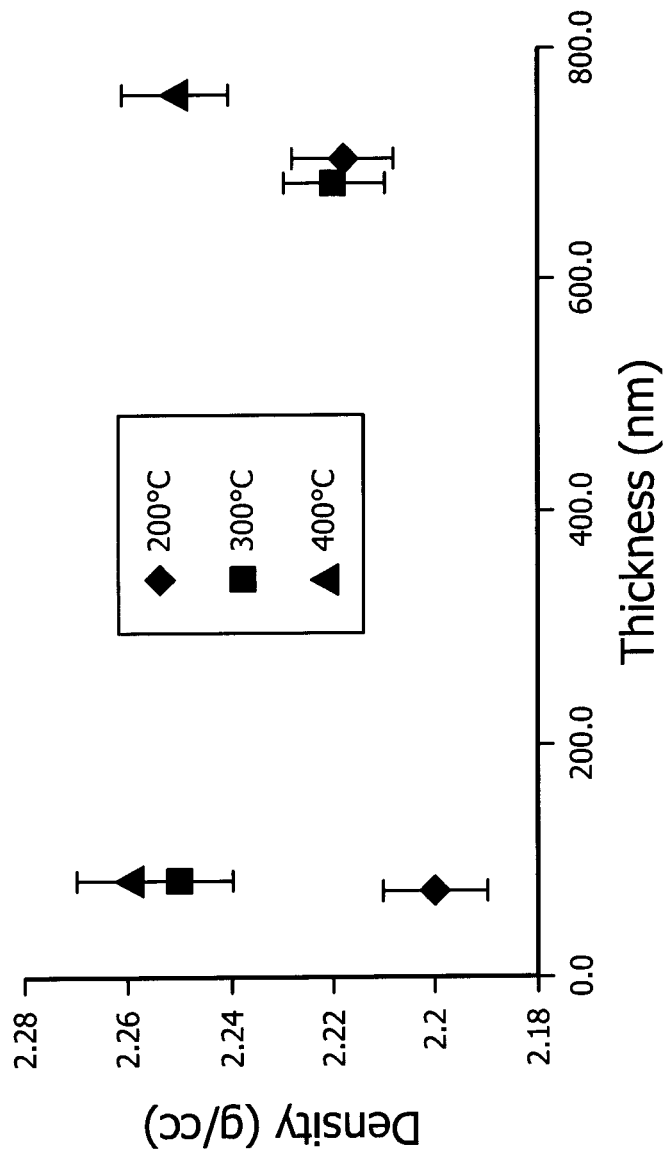
FIG. 1B shows the effect of film thickness on measured density for diethylsilane (2ES) films deposited using the BL-3 process conditions described in the Table 1 of the Examples at 3 different temperatures: 400° C., 300° C., and 200° C.
Figure 2A:
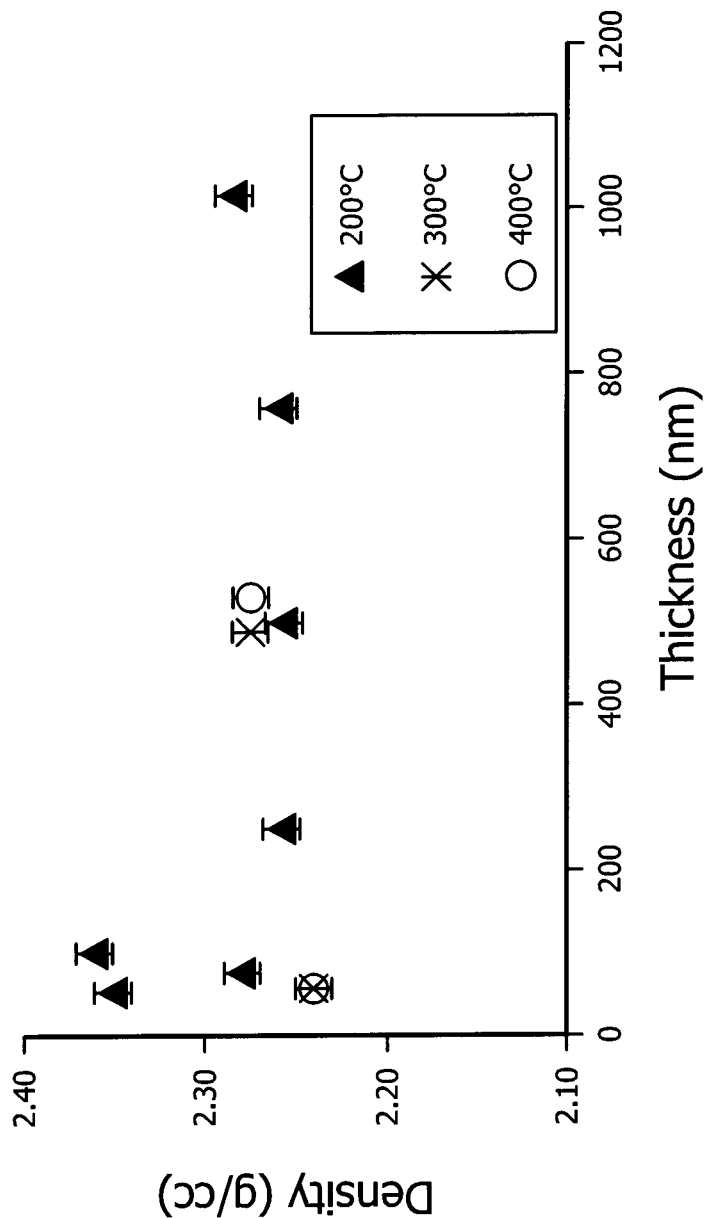
FIG. 2A shows the effect of film thickness on measured density for triethylsilane (3ES) films deposited using the BL-2 process conditions described in Table 1 of the Examples at 3 different temperatures: 400° C., 300° C., and 200° C.

Silicon oxide films were deposited from the silicon precursors 2ES and 3ES $SiO_2$ films were deposited at different temperature and process conditions using the general deposition conditions described above. BL-1 and BL-2 conditions are identical except for precursor flow. While BL-1 process has the highest deposition rate due to higher precursor flow, it is not the most important criterion for gate insulation layers. BL-3 is a lower pressure condition and generally gives poorer films. A comparison of same amount of Si-feed between precursors was used to understand whether a truly better quality film can be produced. As seen in FIGS. 1A and 2A, generally higher densities are obtained for films>200 nm with BL-2 process (>2.2 g/cc) and FIG. 1B, 2B; slightly lower densities were obtained with BL-3 process (~2.2 g/cc). The BL-1 process conditions were not explored in further detail as the densities were expected to be in between those of the BL-2 and BL-3 process conditions.

FIG. 1A shows the effect of film thickness on measured density for 2ES films deposited by BL-2 process condition at 3 temperatures: 400° C., 300° C., and 200° C. Referring to FIG. 1A, the density of the films surprisingly increased as the thickness decreased, particularly at a deposition condition of 300° C. FIG. 1B shows the effect of film thickness on measured density for 2ES films deposited by BL-3 process condition at 3 temperatures: 400° C., 300° C., and 200° C. Referring to FIG. 1B, the density of the films surprisingly increased as the thickness decreased, this is particularly apparent at a deposition condition of 300° C.

FIG. 2A shows the effect of film thickness on measured density for 3ES films deposited by BL-2 process conditions at 3 temperatures: 400° C., 300° C., and 200° C. Surprisingly, the density of the films increased as the thickness decreased, especially at 200° C.

Figure 2B:
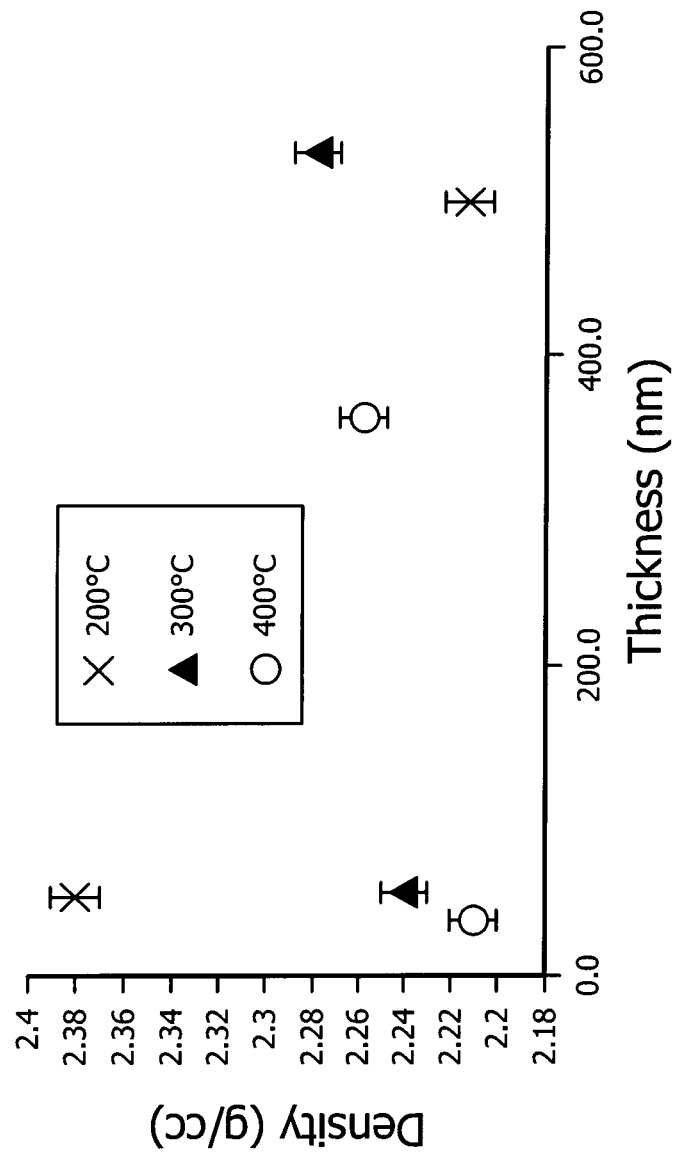
FIG. 2B shows the effect of film thickness on measured density for triethylsilane (3ES) films deposited using the BL-3 process conditions described in Table 1 of the Examples at 3 different temperatures: 400° C., 300° C., and 200° C.

FIG. 2B shows the effect of film thickness on measured density for 3ES films deposited by BL-3 process conditions at 3 temperatures: 400° C., 300° C., and 200° C. Surprisingly, like in FIG. 2A, the density of the films increased as the thickness decreased, especially at 200° C.

Figure 3:
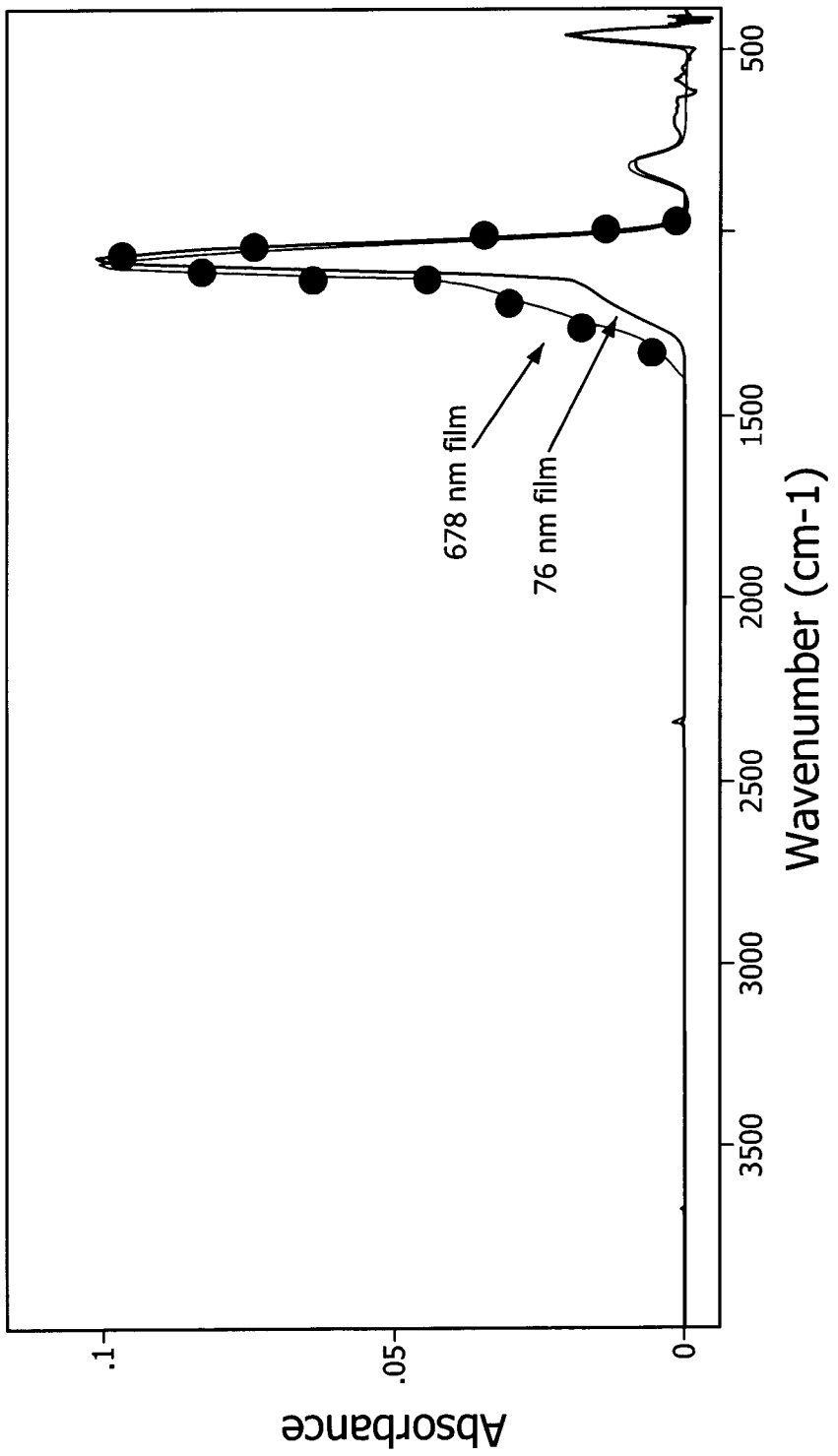
FIG. 3 shows FTIR spectra of thin (e.g., 76 nanometers (nm)) and thick films (e.g., 678 nm) of a diethylsilane (2ES) film deposited using the BL-2 process conditions described in Table 1 of the Examples at 400° C.

FIG. 3 provides a comparison of FTIR spectra of thin (76 nanometer (nm)) and thick films (678 nm) of 2ES oxide deposited by the BL2 condition at 400° C. The spectra indicate that both films are $SiO_2$ only. The absence of Si—H or C—H peaks in the FTIR spectra for the 2ES-deposited films indicates good decomposition of the precursor molecule during the deposition process even at low temperatures. Referring again to FIG. 3, the difference between the shoulder to peak ratio of the ~1050 $cm^{-1}$ peak as thickness increases has been explained by different mechanisms such as strain relaxation, geometric effects, in-situ annealing effects and oxygen deficiency. This effect is observed in high quality thermally grown $SiO_2$ films.

The H-content in atomic % and measured by RBS for the DES deposited films which were deposited at a BL-1 process condition at deposition temperature of 350° C. and 250° C. were 2.0% (density of 2.25 $g/cm^3$) and 2.8% (density of 2.26 $g/cm^3$), respectively. This shows that both DES deposited films had very low total hydrogen content (<5%) as measured by RBS/HFS. This is also confirmed by a FTIR analysis of these films which showed no detectable Si—H and very minimal Si—OH bonding.

Example 2

Comparison of Silicon Oxide Films Deposited Using BL2 Process Condition and Tetraethoxysilane (TEOS) vs. Diethysilane (2ES)

Figure 1C:
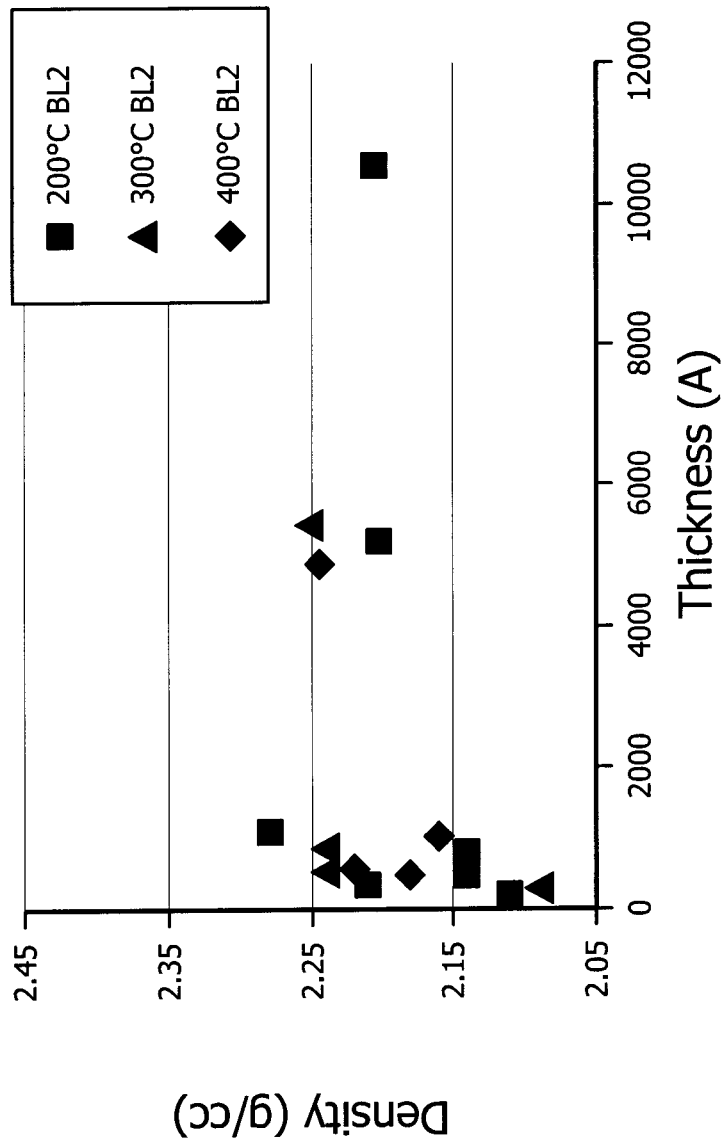
FIG. 1C shows the effect of film thickness on measured density for tetraethoxysilane (TEOS) films deposited using the BL-2 process conditions described in the Table 1 of the Examples at 3 different temperatures: 400° C., 300° C., and 200° C.
Figure 1D:
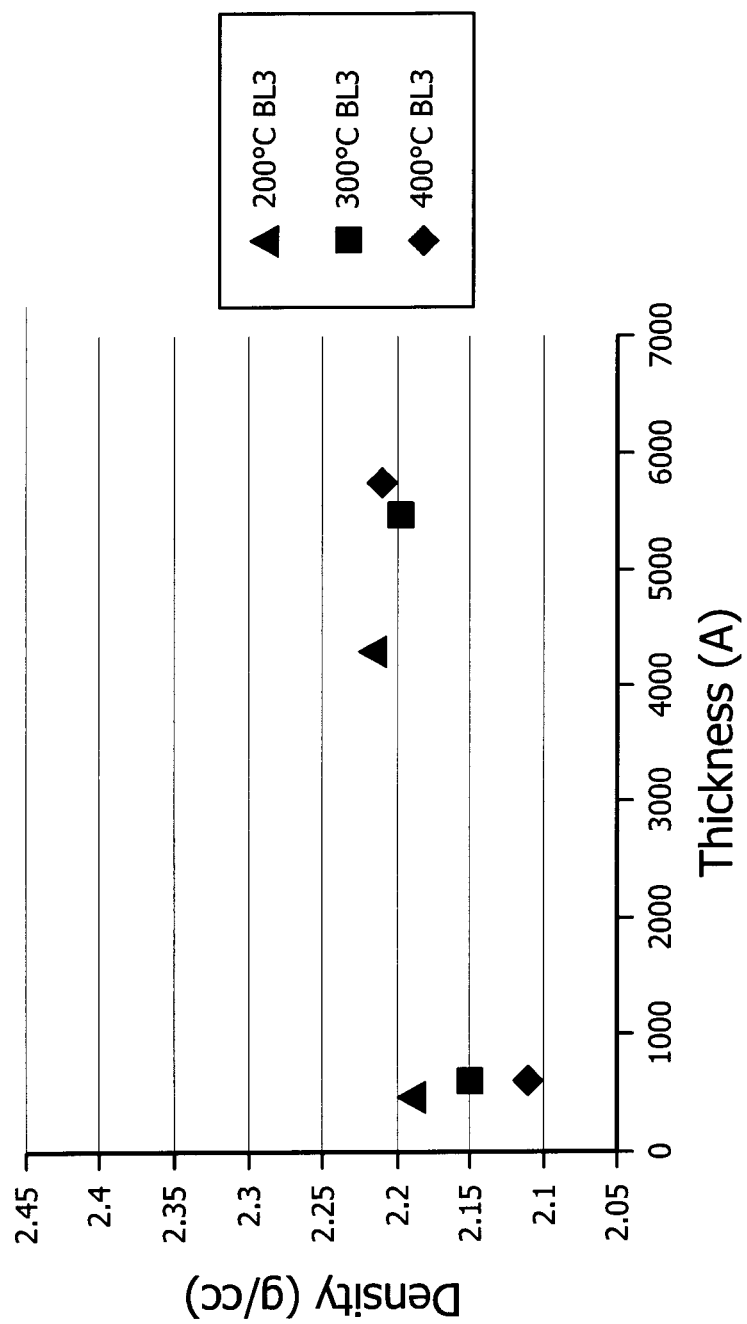
FIG. 1D shows the effect of film thickness on measured density for TEOS films deposited using the BL-3 process conditions described in the Table 1 of the Examples at 3 different temperatures: 400° C., 300° C., and 200° C.

$SiO_2$ films were deposited using the process conditions described above in the general deposition conditions and in Table 1. In FIGS. 1C and 1D, TEOS deposited silicon oxide films having different thicknesses were deposited at the same BL-2 and BL-3 process conditions described above in Table 1. Referring to FIG. 1C, compared to the 2ES and 3ES films deposited using BL-2 at identical deposition temperatures (see FIG. 1A and FIG. 2A), at lower deposition temperatures such as 200° C., the TEOS-deposited films generally had lower density than the 2ES or 3ES films. A similar effect was observed when comparing the data in FIG. 1D with the data for the 2ES films and 3ES films in FIGS. 1B and 2B) for the same deposition temperatures. The 2ES and 3ES films generally exhibited equal or higher density for the thinner films. In general, the density of TEOS film drops to <2.2 g/cc for <200 nm films for both process conditions.

Figure 4A:
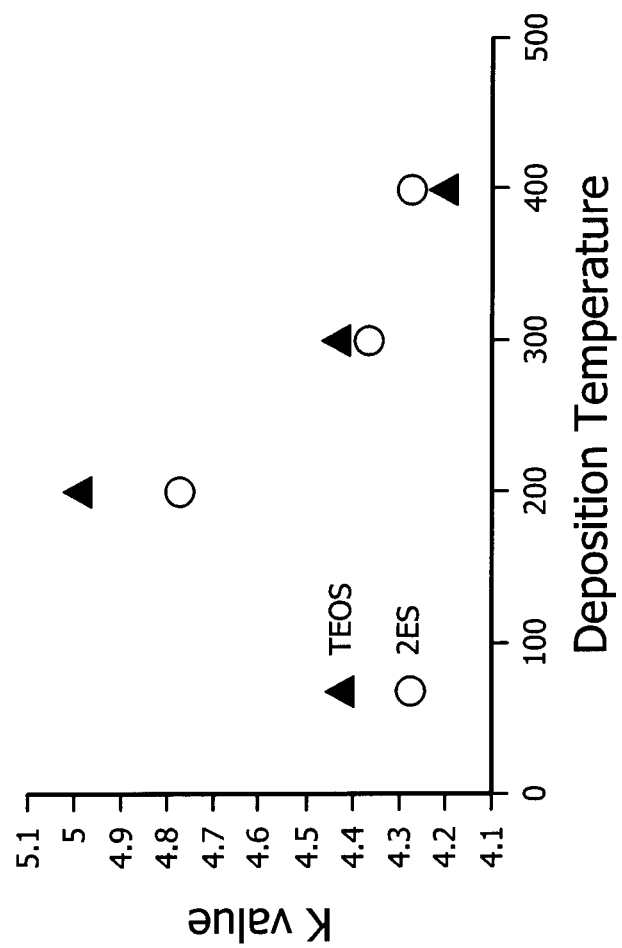
FIG. 4A shows a comparison of dielectric constant ("K") values of TEO-deposited films and 2ES-deposited films deposited using the BL-1 process conditions described in Table 1 at 3 different temperatures: 400° C., 300° C., and 200° C.

FIG. 4A shows a comparison of dielectric constant ("K") values of TEOS-deposited films and 2ES-deposited films which were deposited using the BL-1 condition described above at 3 different temperatures: 400° C., 300° C., and 200° C. The dielectric constant of a good quality thermally grown or convention chemical vapor deposited $SiO_2$ is 4.0. For PECVD oxides deposited at 400° C., the K value varies as a function of process conditions. It is possible to optimize the process to get K values of 4.1 to 4.3 for a good quality 400° C. PECVD $SiO_2$ films. However, at increasingly lower deposition temperatures, the film quality typically degrades as evidenced by poorer film density and the increasing ability of the film to absorb moisture, which thereby increases the K value. FIG. 4A shows that the 2ES-deposited films have better K values than the TEOS-deposited films at deposition temperatures of 200° C. and 300° C. This indicates that these films are denser and of better quality than the TEOS films deposited at the same process condition. Similar behavior was also seen for the BL-2 and BL-3 process conditions.

Figure 4B:
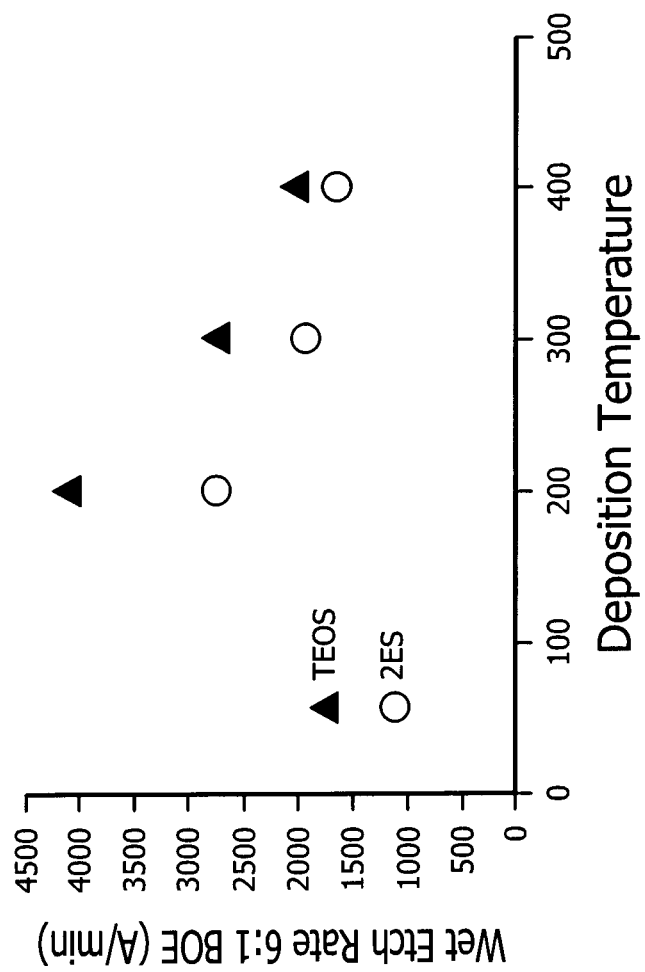
FIG. 4B shows a comparison of wet etch rate (WER) of TEO-deposited films and 2ES-deposited films deposited using the BL-1 process conditions described in Table 1 at 3 different temperatures: 400° C., 300° C., and 200° C.

FIG. 4B shows a comparison of wet etch rate (WER) of TEOS-deposited films and 2ES-deposited films which were deposited using the BL-1 condition described above at 3 different temperatures: 400° C., 300° C., and 200° C. FIG. 4B shows that the 2ES deposited films had lower WER than the TEOS deposited films at all temperatures. This confirms the superior quality of the 2ES films for certain applications. Similar behavior was also seen for the BL-2 and BL-3 process conditions.

Figure 5:
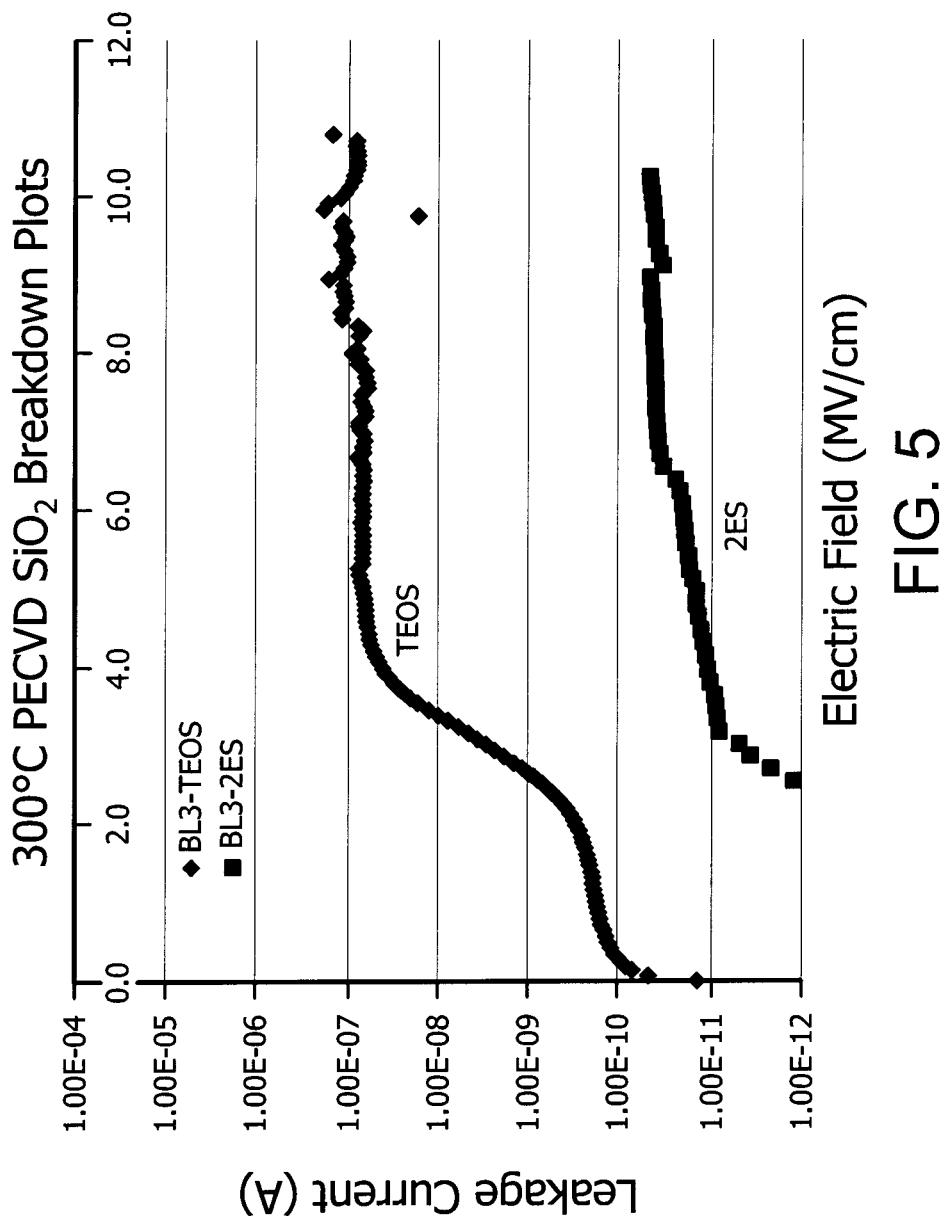
FIG. 5 shows a comparison of the leakage current vs. electric field deposited TEOS films and the 2ES-deposited films deposited using the BL-3 process conditions described in Table 1 at 300° C.

FIG. 5 shows the leakage current versus electric field for the 300° C. deposited TEOS films vs. the DES-deposited films at the BL3 processing condition. The leakage current for the DES-deposited films remained low whereas the TEOS-deposited films exhibited poor leakage. Thoughout all the other deposition temperatures and process conditions, DES was clearly better than TEOS.

Figure 6:
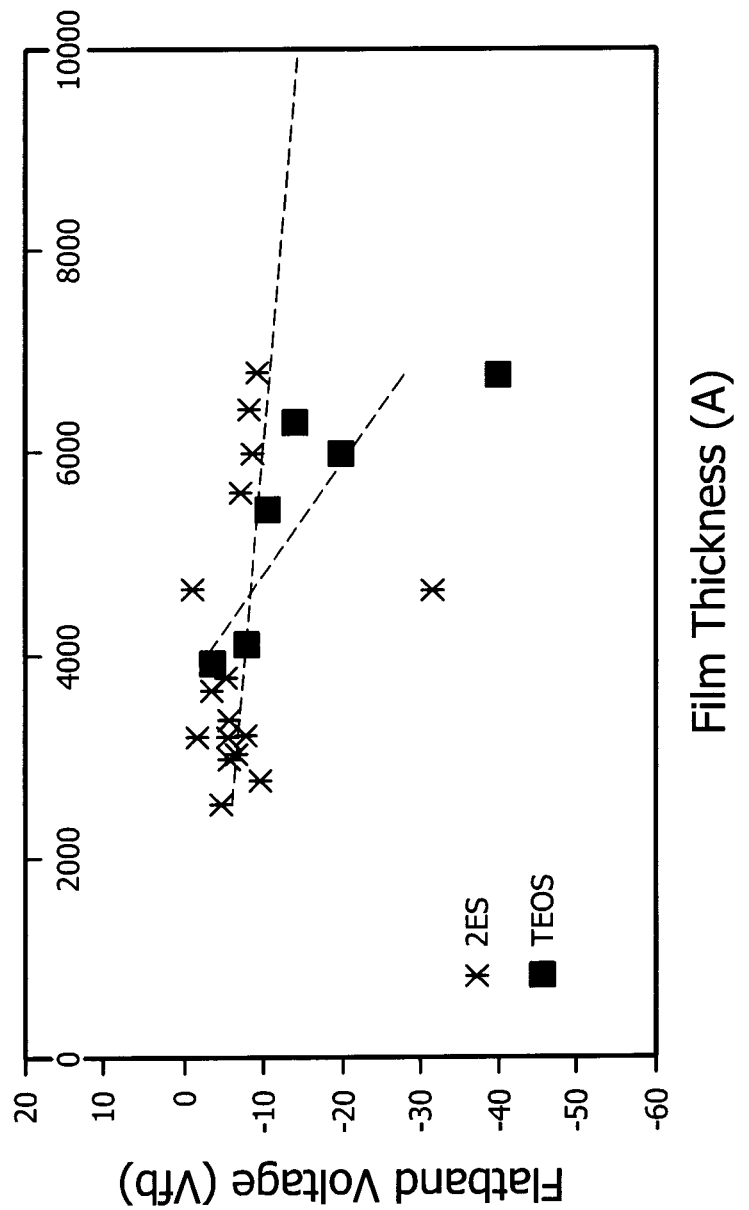
FIG. 6 shows a comparison of the flatband voltage (Vfb) vs. thickness measured in Angstroms (Å) for 2ES and TEOS SiO$_2$ deposited films using conditions in Table 1.

The interface and bulk charges in 2ES and TEOS $SiO_2$ films are compared in FIG. 6 by tracking the flatband voltage (Vfb). For TEOS films, the flatband voltage becomes more negative as the film becomes thicker, indicating more bulk charges (e.g., defective bonds) in the film. In contrast, 2ES films showed the ability to keep Vfb close to 0 V, minimizing both interface and bulk charges. In this plot, the precursors are not compared at the same process condition as their film thicknesses were different; and that affects the Vfb value.

The stoichiometry of the $SiO_2$ was measured by XPS and the O/Si ratio was found to be 2.17 for TEOS oxide and 2.1 for 2ES oxide at 200° C. and BL-1 condition. Without being bound by theory, it is proposed that an O/Si ratio>2.0 is possibly due to Si—OH groups in the film. It is seen that 2ES has less deviation from stoichiometry and appears to be consistent with the dielectric constant and WER data.

Without being bound by theory, the precursors described herein have the capability to deposit thinner films (e.g., 2 nm to 200 nm) of higher quality due to such surface mobility and chemical reactivity improvements. This is surprising because the thinner DES or 3ES films had better density.

Example 3

Deposition of Thin $SiO_2$ Films Using 3ES with High Density and Electric Properties Process conditions for the 3ES silicon oxide films were screened using a design of experiment (DOE) methodology summarized below: precursor flow from 10 to 200 sccm; $O_2$/He flow from 100 to 1000 sccm, pressure from 0.75 to 10 torr; Low-frequency (LF) power 0 to 100 W; and deposition temperature ranged from 25 to 350° C. The DOE experiments were used to determine what process parameters produced the optimal film for use as a gate insulating layer in a display device.

$SiO_2$ films were deposited using the precursor 3ES at even lower deposition temperatures, such as 100° C., 125° C. and 150° C. then described above in the previous examples. By optimizing the process parameters, such as precursor flow, chamber pressure and power density, high density and thin $SiO_2$ films are obtained. Table 2 shows a summary of the three process conditions used for 3ES film deposited at different temperatures 100° C., 125° C. and 150° C., as well as certain film properties, such as thickness, k value and density which were measured using the methods described herein in the general deposition conditions. In general, the films deposited using 3ES had a thickness less than 200 nm, a k value between 4 to 5, and a density higher than 2.2 $g/cm^3$.

Figure 8:
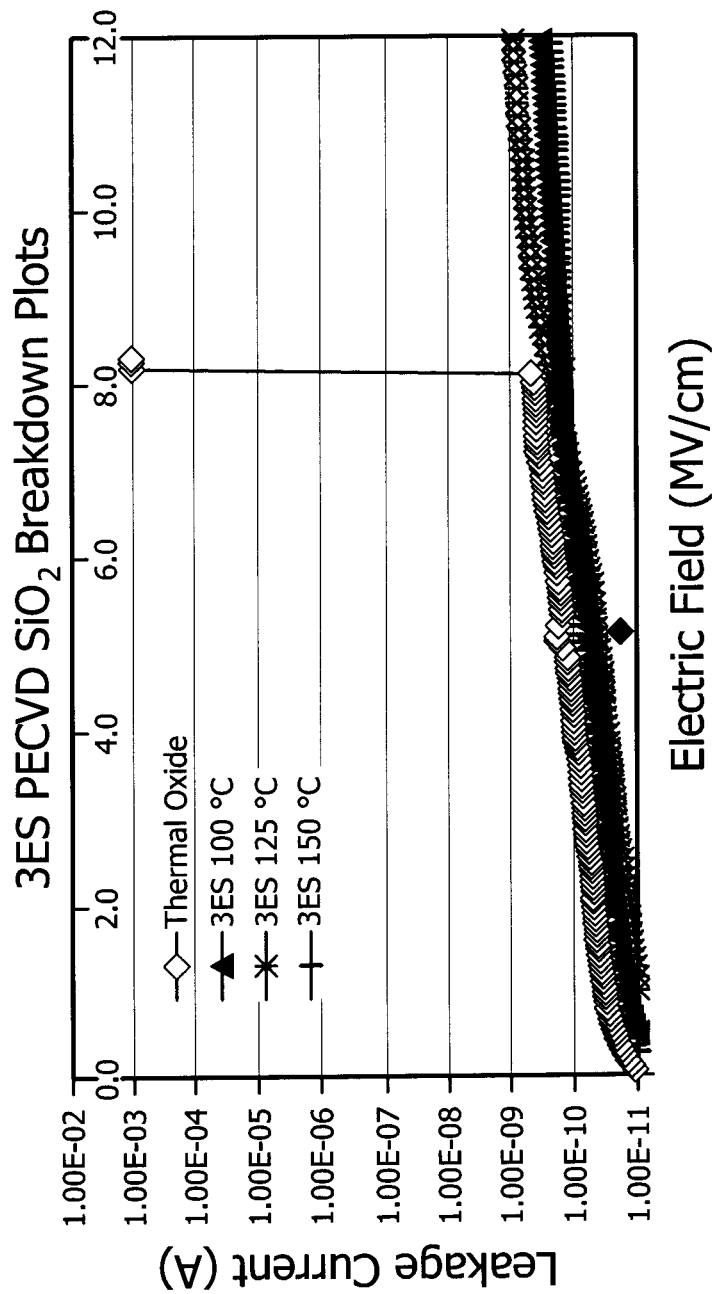
FIG. 8 provides the relationship between leakage current measured in amperes versus electric field measured in (MV/cm) for 3ES films that were deposited at the following temperatures: 100° C., 125° C., and 150° C. using the process conditions in Table 2.

FIG. 8 shows the leakage current vs electric field for the 3ES deposited films at the three different deposition temperatures. The leakage current for the 3ES-deposited films is comparable to thermal oxide leakage current. The break down voltage is comparable or even better then thermal oxide. Breakdown voltage refers to the voltage at which the electric current begins to flow when a formed film is placed between the electrodes and voltage is applied. Since thin films such as silicon oxide films play the role of blocking the flow of charges in a semiconductor device, breakdown voltage is a very important indicator as an electrical property of a thin film. In order for a film, such as a silicon oxide film, to be used as an insulation material in a semiconductor device, the material should have a breakdown voltage of about 8~12 MV/cm in general (so-called intrinsic breakdown region, exhibited by a thermally oxidized silicon oxide film). If there are any weak spots or defects in the films, the breakdown voltage is reduced. FIG. 8 shows that the breakdown voltage of the 3ES-deposited silicon oxide is comparable to or even better then the thermal oxide.

Figure 9:
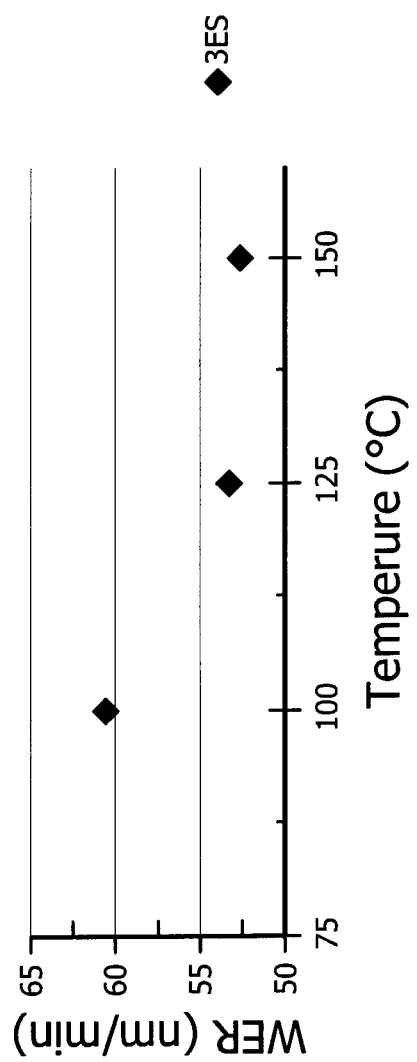
FIG. 9 provides the wet etch rate of for 3ES films that were deposited at the following temperatures: 100° C., 125° C., and 150° C. using the process conditions in Table 2.

The wet etch rate was also obtained for these films using also studied with 0.5% HF and the method described above in the general deposition conditions. FIG. 9 provides the WER of the 3ES-deposited $SiO_2$ films at 100° C., 125° C. and 150° C. using the process conditions shown in Table 2. The WER of the film does not appear to have a significant big change when the film is deposited at lower deposition temperatures. This confirms the superior quality of the 3ES films at low temperatures.

TABLE 2

Summary of process conditions used for 3ES film deposited at different temperatures 100° C., 125° C. and 150° C. and the films properties.

| Process conditions | 3ES 100° C. | 3ES 125° C. | 3ES 150° C. |
| --- | --- | --- | --- |
| Precursor flow (sccm) | 27 | 48 | 27 |
| He (carrier, sccm) | 1000 | 1000 | 1000 |
| $O_2$ (sccm) | 1000 | 1000 | 1000 |
| Pressure (torr) | 9.2 | 9.2 | 9.2 |
| Spacing (mils) | 500 | 500 | 500 |
| Power density ($W/cm^2$) | 1.75 | 2.5 | 2.5 |
| Film thickness (nm) | 165 | 113 | 173 |
| Film Density ($g/cm^3$) | 2.26 | 2.29 | 2.28 |
| K value | 4.67 | 4.62 | 4.42 |

Example 4

Deposition of Thin SiO$_2$ Films Using 2ES with High Density and Electric Properties Process conditions for the 2ES silicon oxide films were screened at T<200 C. using a design of experiment (DOE) methodology summarized below: typical precursor flow rates were 25-150 sccms, plasma power density was 0.5-3 W/cm$^2$, and pressure was 0.75-12 torr.

The SiO$_2$ films are also deposited at a deposition temperature of 100° C. using 2ES. By optimizing the process parameters, such as precursor flow, chamber pressure and power density, and other process conditions, high density and thin SiO$_2$ films are obtained. Table 3 shows a summary of the process conditions used for 2ES film deposited at 100° C. as well as the certain film properties, such as thickness, k value and density which were obtained using the methods described herein. The film had a thickness less than 200 nm and density higher than 2.2 g/cc.

Figure 10:
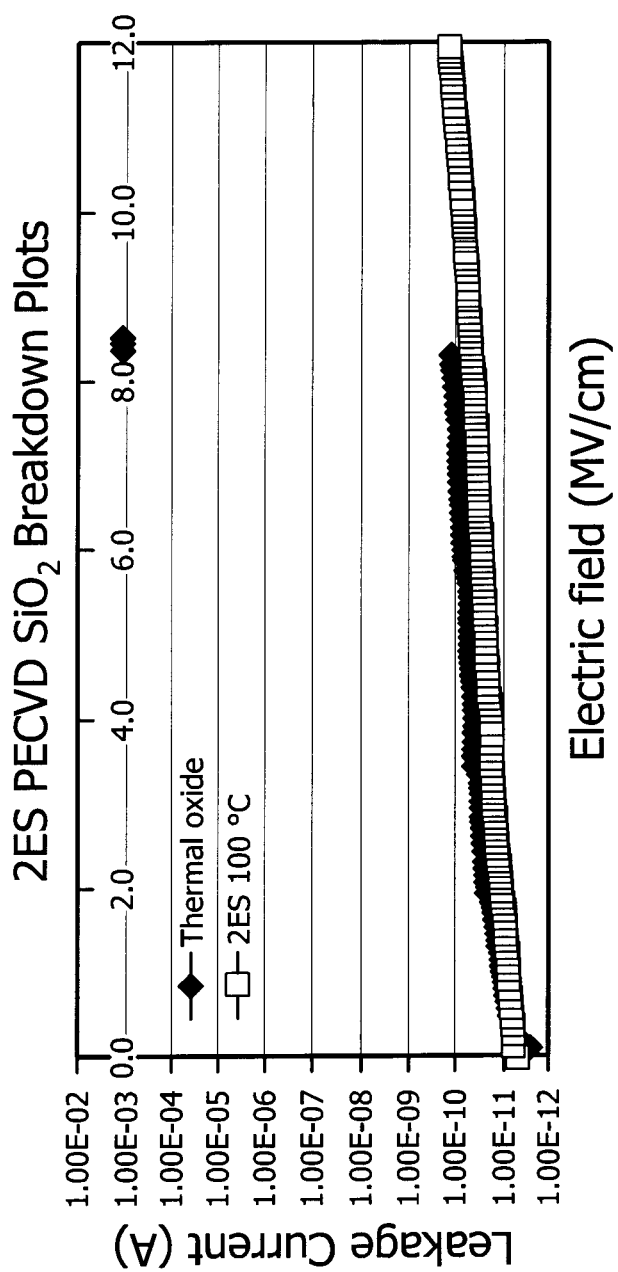
FIG. 10 provides the relationship between leakage current measured in amperes versus electric field measured in (MV/cm) for 2ES films that were deposited at 100° C. using the process conditions in Table 3.

FIG. 10 shows the leakage current vs. electric field for the 2ES film deposited at 100° C. with process conditions in Table 3. The leakage current for the 2ES-deposited films is comparable to thermal oxide leakage current. FIG. 10 shows that the break down voltage for the 100° C. deposited 2ES film is comparable or even better then thermal oxide.

TABLE 3

Summary of process conditions used for 2ES-deposited SiO$_2$ film at 100° C. and film properties.

| Process conditions | 2ES 100° C. |
| --- | --- |
| Precursor flow (sccm) | 38 |
| He (carrier, sccm) | 1000 |
| O$_2$ (sccm) | 1000 |
| Pressure (Torr) | 10 |
| Spacing (mils) | 500 |
| Power density (W/cm$^2$) | 1.5 |
| Film thickness (nm) | 195 |
| Density (g/cm$^3$) | 2.21 |
| K value | 5.05 |

Example 5

Deposition of Thin SiO$_2$ Films Using 3ES at 100° C. With High Density

The present example is used to show the deposition of thin and high density SiO$_2$ film using 3ES provides a wide process window. Table 4 provides the process conditions for two 3ES deposited, SiO$_2$ films and film properties at different precursor flows, 29 sccm and 68 sccm. Although the table shows a wide range of deposition rates, high density films were obtained.

TABLE 4

Summary of Process Conditions for 100° C. 3ES Depositions

| Process conditions | 100° C. | 100° C. |
| --- | --- | --- |
| Precursor flow (sccm) | 29 | 68 |
| He (carrier, sccm) | 1000 | 1000 |
| O$_2$ (sccm) | 1000 | 1000 |
| Pressure (Torr) | 9.2 | 9.2 |
| Spacing (mils) | 500 | 500 |
| Power density (W/cm$^2$) | 2.5 | 2.5 |
| Deposition rate (nm/min) | 27 | 89 |
| Film thickness (nm) | 160 | 222 |
| K value | 4.77 | 5.07 |
| Density (g/cm$^3$) | 2.26 | 2.23 |

Example 6

Compositional Data of Thin SiO$_2$ Films Deposited Using 3ES at 100° C. and 150° C.

XPS is used to exam the carbon concentration in the film. The relative atomic percentage is measured at the surface and after 50 nm sputtering. Table 5 shows the process conditions and film properties of two 3ES films deposited at 100° C. and 150° C. Table 6 provides the XPS data of the films. No carbon was detected in the bulk film and the O/Si ratio of the film was very close to 2.0 or stoichiometric.

TABLE 5

Summary of process conditions and film properties of 3ES films.

| Process conditions | 3ES 150° C. | 3ES 100° C. |
| --- | --- | --- |
| Precursor flow (sccm) | 68 | 50 |
| He (carrier, sccm) | 1000 | 1000 |
| O$_2$ (sccm) | 1000 | 1000 |
| Pressure (Torr) | 9.2 | 9 |
| Spacing (mils) | 500 | 700 |
| Power density (W/cm$^2$) | 2.5 | 2.0 |
| Film thickness (nm) | 210 | 206 |
| K value | 4.69 | 4.84 |
| Density (g/cm$^3$) | 2.25 | 2.27 |

TABLE 6

XPS data of 3ES films deposited Using Table 5 Process Conditions.

| Sample ID | Location | Condition | O | N | C | Si | O/Si |
| --- | --- | --- | --- | --- | --- | --- | --- |
| 3ES 150° C. | A | As Received | 62.0 | ND | 8.5 | 29.5 | 2.10 |
| | | After 500 Å Sputter | 66.8 | ND | ND | 33.2 | 2.01 |
| | B | As Received | 63.0 | ND | 9.4 | 27.7 | 2.28 |
| | | After 500 Å Sputter | 67.3 | ND | ND | 32.7 | 2.06 |
| 3ES 100° C. | A | As Received | 57.5 | ND | 15.7 | 26.9 | 2.1 |
| | | After 500 Å Sputter | 66.7 | ND | | 33.3 | 2.0 |
| | B | As Received | 61.4 | ND | 9.4 | 29.3 | 2.1 |
| | | After 500 Å Sputter | 66.5 | ND | | 33.5 | 2.0 |

Example 6

Stability Analysis of Thin SiO$_2$ Films Deposited Using 3ES Stability

Figure 11:
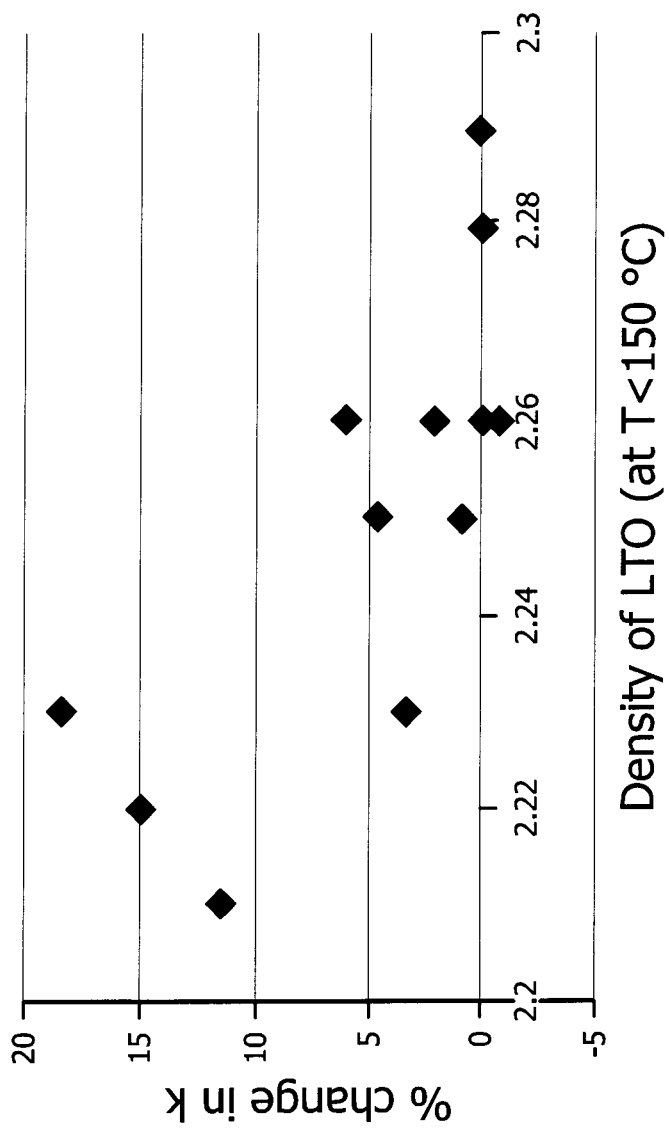
FIG. 11 provides the relationship between the percentage change ii dielectric constant (K) and density for the low temperature oxide film described in Example 6.

The optimized low temperature oxide has good stability as shown herein in Tables 7a and 7b and FIG. 11. Tables 7a and 7b shows the k value change of several SiO$_2$ films deposited by 3ES after 3 weeks in air. It can be seen that the film in table 7a are very stable after 3 weeks (less than 2.5% change in k value) while those in table 7b are not so stable (3-20% change in k value). The average density of the films in table 7a is higher than in table 7b, which is consistent with stability. So the optimized film has good stability despite being very thin. In general, a trend is seen between density and k stability, with the highest density (2.28 g/cc) film showing 0% change in k value and the films with <2.23 g/cm$^3$ showing significant change in k value (>3%).

The electric breakdown field and leakage current are also measured for the 3ES SiO$_2$ films after 3 months The leakage current and break down electric field for the 3ES-deposited films is comparable to thermal oxide, showing a leakage current less than 10$^{-7}$ A/cm$^2$ below electric field 6 MV/cm and the breakdown voltage higher than 7 MV/cm.

Table 7a shows the stability of K value of the low temperature oxide.

| | Temperature (° C.) | | | | | | | |
|---|---|---|---|---|---|---|---|---|
| | 100 | 100 | 125 | 125 | 125 | 150 | 150 | 150 |
| Thickness (nm) | 160 | 263 | 225 | 113 | 166 | 174 | 210 | 173 |
| Density (g/cm$^3$) | 2.26 | 2.26 | 2.26 | 2.29 | 2.26 | 2.26 | 2.25 | 2.28 |
| K | 4.77 | 4.98 | 4.80 | 4.61 | 4.62 | 4.40 | 4.69 | 4.42 |
| K (3 weeks later) | 4.87 | 4.97 | 4.91 | 4.62 | 4.72 | 4.36 | 4.73 | 4.42 |

Table 7b shows the stability of K value of the low temperature oxide.

| | Temperature (° C.) | | | | | |
|---|---|---|---|---|---|---|
| | 100 | 100 | 125 | 150 | 150 | 150 |
| Thickness | 223 | 260 | 443 | 232 | 224 | 263 |
| Density | 2.23 | 2.21 | 2.23 | 2.25 | 2.26 | 2.22 |
| K | 5.07 | 5.43 | 5.07 | 4.74 | 4.47 | 4.77 |
| K (3 weeks later) | 5.24 | 6.05 | 6.00 | 4.96 | 4.74 | 5.48 |

The working example and embodiments of this invention listed above, are exemplary of numerous embodiments that may be made of this invention. It is contemplated that numerous materials other than those specifically disclosed may be made. Numerous other configurations of the process may also be used, and the materials used in the process may be elected from numerous materials other than those specifically disclosed.

The invention claimed is:

1. A method for depositing a silicon-containing film on at least one surface of a device comprising a metal oxide, the method comprising:
   providing the at least one surface of the device in a reaction chamber;
   introducing an alkylsilane precursor selected from the group consisting of diethylsilane and triethylsilane into the reaction chamber;
   introducing into the reaction chamber an oxygen source; and
   depositing by a PECVD deposition process the silicon containing film on the at least one surface of the device at one or more reaction temperatures ranging from 25° C. to 150° C. wherein the silicon containing film comprises a thickness ranging from about 2 nanometers to about 200 nanometers and a density of about 2.25 g/cm$^3$ or greater,
   wherein the metal oxide comprises at least one member selected from the group consisting of indium gallium zinc oxide, indium tin oxide, aluminum indium oxide, zinc tin oxide, zinc oxynitride, magnesium zinc oxide, zinc oxide, InGaZnON, ZnON, ZnSnO, CdSnO, GaSnO, TiSnO, CuAlO, SrCuO, and LaCuOS,
   wherein the silicon-containing film has a hydrogen content of about 5 atomic % or less, and
   wherein the silicon-containing film has a O/Si ratio that ranges from about 1.9 to about 2.1.

2. The method of claim 1 wherein the device further comprises a gate electrode.

3. The method of claim 1 wherein the alkylsilane precursor comprises diethylsilane.

4. The method of claim 1 wherein the oxygen source is selected from the group consisting of water (H$_2$O), oxygen (O$_2$), oxygen plasma, ozone (O$_3$), NO, N$_2$O, carbon monoxide (CO), carbon dioxide (CO$_2$) and combinations thereof.

5. The method of claim 1, wherein the deposition process is plasma enhanced chemical vapor deposition (PECVD) with dual RF frequency sources.

6. The method of claim 1, wherein the alkylsilane precursor comprises triethylsilane.

7. The method of claim 1 wherein the silicon-containing film having a leakage current less than 10$^{-7}$ A/cm$^2$ below electric field 6 MV/cm and the breakdown voltage is higher than 7 MV/cm.

8. A method for depositing a silicon containing film on at least one surface in a thin film transistor device, comprising:
   providing the at least one surface of the thin film transistor in a reaction chamber;
   introducing an alkylsilane precursor selected from the group consisting of diethylsilane and triethylsilane into the reaction chamber;
   introducing into the reaction chamber an oxygen source; and
   depositing via a PECVD deposition process the silicon containing film on the at least one surface of the thin film transistor device at one or more reaction temperatures ranging from 25° C. to 150° C. wherein the silicon containing film comprises a thickness ranging from about 2 nanometers to about 200 nanometers and a density of about 2.2 g/cm$^3$ or greater, and
   wherein the silicon-containing film having a leakage current less than 10$^{-7}$ A/cm$^2$ below electric field 6 MV/cm and the breakdown voltage is higher than 7 MV/cm.

9. The method of claim 8, wherein the alkylsilane precursor comprises diethylsilane.

10. The method of claim 8, wherein the oxygen source is selected from the group consisting of water (H$_2$O), oxygen (O$_2$), oxygen plasma, ozone (O$_3$), NO, N$_2$O, carbon monoxide (CO), carbon dioxide (CO$_2$) and combinations thereof.

11. The method of claim 8, wherein the deposition process comprises plasma enhanced chemical vapor deposition (PECVD) with dual RF frequency sources.

12. The method of claim 8, wherein the silicon containing layer is a gate insulation layer in a thin film transistor device.

13. The method of claim 8 wherein the silicon-containing film has a O/Si ratio which ranges from about 1.9 to about 2.1.

* * * * *